(12) United States Patent
Tano et al.

(10) Patent No.: US 8,253,137 B2
(45) Date of Patent: Aug. 28, 2012

(54) LAMINATE STRUCTURE, ELECTRONIC DEVICE, AND DISPLAY DEVICE

(75) Inventors: Takanori Tano, Kanagawa (JP); Atsushi Onodera, Tokyo (JP); Koei Suzuki, Kanagawa (JP); Hidenori Tomono, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 233 days.

(21) Appl. No.: 12/669,290

(22) PCT Filed: Jul. 15, 2008

(86) PCT No.: PCT/JP2008/063096
§ 371 (c)(1),
(2), (4) Date: Jan. 15, 2010

(87) PCT Pub. No.: WO2009/011445
PCT Pub. Date: Jan. 22, 2006

(65) Prior Publication Data
US 2010/0181571 A1 Jul. 22, 2010

(30) Foreign Application Priority Data

Jul. 18, 2007 (JP) .................. 2007-187629
Jul. 18, 2007 (JP) .................. 2007-187630
Jul. 18, 2007 (JP) .................. 2007-187631

(51) Int. Cl.
*H01L 29/04* (2006.01)
*H01L 31/00* (2006.01)
(52) U.S. Cl. ............ 257/57; 257/E29.289; 257/E33.004
(58) Field of Classification Search .................... 257/57, 257/E29.289, E33.004
See application file for complete search history.

(56) References Cited

U.S. PATENT DOCUMENTS

| 5,448,113 | A | 9/1995 | Suzuki et al. |
| 7,166,689 | B2 | 1/2007 | Sagisaka et al. |
| 7,508,078 | B2 | 3/2009 | Kondo et al. |
| 7,550,554 | B2 | 6/2009 | Sagisaka et al. |

(Continued)

FOREIGN PATENT DOCUMENTS

JP 3 281783 12/1991

(Continued)

OTHER PUBLICATIONS

U.S. Appl. No. 08/027,985, filed Mar. 8, 1993, Suzuki, et al.

(Continued)

*Primary Examiner* — Lex Malsawma
(74) *Attorney, Agent, or Firm* — Oblon, Spivak, McClelland, Maier & Neustadt, L.L.P.

(57) ABSTRACT

A laminate structure is disclosed that has a region having high surface free energy and a region having low surface free energy that are well separated, has high adhesiveness between an underlying layer and a conductive layer, and can be formed easily with low cost. The laminate structure includes a wettability-variable layer including a first surface free energy region of a first film thickness and a second surface free energy region of a second film thickness, and a conductive layer formed on the second surface free energy region of the wettability-variable layer. The second film thickness is less than the first film thickness and the surface free energy of the second surface free energy region is made higher than the surface free energy of the first surface free energy region by applying a predetermined amount of energy on the second surface free energy region.

14 Claims, 14 Drawing Sheets

U.S. PATENT DOCUMENTS

| | | |
|---|---|---|
| 7,612,455 B2 | 11/2009 | Tano et al. |
| 2003/0059987 A1 | 3/2003 | Sirringhaus et al. |
| 2005/0176242 A1 | 8/2005 | Kawase |
| 2006/0124925 A1 | 6/2006 | Kondo et al. |
| 2007/0054212 A1 | 3/2007 | Akiyama et al. |
| 2007/0096088 A1 | 5/2007 | Tano et al. |
| 2008/0029766 A1 | 2/2008 | Onodera et al. |
| 2010/0181571 A1* | 7/2010 | Tano et al. ............. 257/59 |

FOREIGN PATENT DOCUMENTS

| | | |
|---|---|---|
| JP | 2003 518332 | 6/2003 |
| JP | 2003 315813 | 11/2003 |
| JP | 2004 96106 | 3/2004 |
| JP | 2004 141856 | 5/2004 |
| JP | 2005 159143 | 6/2005 |
| JP | 2005 310962 | 11/2005 |
| JP | 2006 21491 | 1/2006 |
| JP | 2006 60113 | 3/2006 |
| JP | 2006 114527 | 4/2006 |
| JP | 2006 114579 | 4/2006 |
| JP | 2006 278534 | 10/2006 |
| JP | 2007 12590 | 1/2007 |
| JP | 2007 43131 | 2/2007 |
| JP | 2007 150246 | 6/2007 |

OTHER PUBLICATIONS

U.S. Appl. No. 12/548,208, filed Aug. 26, 2009, Tano, et al.

Office Action issued Dec. 29, 2011, in Taiwanese Patent Application No. 097127172 (with English-language translation).

* cited by examiner

LAMINATE STRUCTURE, ELECTRONIC DEVICE, AND DISPLAY DEVICE

TECHNICAL FIELD

The present invention relates to a laminate structure, an electronic device using the laminate structure, methods of fabricating the laminate structure and the electronic device, and a display device.

BACKGROUND ART

In these years, extensive studies are being made on organic thin film transistors using organic semiconductor materials. Advantages of using organic semiconductor materials in transistors include flexibility and increased areas of the transistors, a simplified fabrication process due to a simple layer structure of the transistors, and possible usage of inexpensive fabrication equipment.

In addition, by utilizing a printing method, the organic thin film transistors can be fabricated at much lower cost compared to a photolithographic technique used on silicon-based semiconductors of the related art. In addition, by using the printing method, spin-coating, or immersing, it is possible to form a thin film or circuits easily.

One of parameters indicating performance of the thin film transistor is the ratio of the current in an ON state to the current in an OFF state, usually expressed as Ion/Ioff. In the thin film transistor, a saturation current Ids flowing through a source electrode and a drain electrode is expressed by formula (1) below.

$$Ids = \mu C_{in} W (V_G - Vth)^2 / 2L \quad (1)$$

In formula (1), $\mu$ represents field effect mobility, $C_{in}$ represents capacitance per unit area of a gate insulating film, W represents a channel width, L represents a channel length, $V_G$ represents a gate voltage, and Vth represents a threshold voltage.

In addition, $C_{in}$ is expressed by formula (2) below.

$$C_{in} = \epsilon \cdot \epsilon_0 / d \quad (2)$$

In formula (2), $\epsilon$ represents specific permittivity of the gate insulating film, $\epsilon_0$ represents specific permittivity in a vacuum, and d represents thickness of the gate insulating film.

From the formula (1), it is clear that in order to increase the ON state current Ion, it is effective to 1. increase the field effect mobility $\mu$,
2. shorten the channel length L,
3. increase the channel width W.

The field effect mobility $\mu$ strongly depends on material properties, and material development is being extensively made to increase the field effect mobility $\mu$.

The channel length L is determined by the device structure, thus it is attempted to increase the ON current Ion by appropriately modifying the device structure. In the related art, it is well known that the channel length L can be shortened by shortening the distance between the source electrode and the drain electrode.

For the organic semiconductor materials, in order to increase the field effect mobility $\mu$ compared to inorganic semiconductor materials, such as silicon semiconductor, it is usually required for the channel length L be less than 10 μm, and preferably, less than 5 μm. It is known that the photolithographic technique, which is frequently used in silicon processes, is one of the methods able to precisely shorten the distance between the source electrode and the drain electrode.

Usually, a photolithographic process includes the following steps:

1. applying a photo-resist layer on a substrate having a thin-film layer (a photo-resist application step),
2. removing a solvent by heating (a pre-baking step),
3. irradiating ultraviolet rays through a hard mask, which is obtained by writing with a laser beam or an electron beam in accordance with pattern data (an exposing step),
4. removing the resist in an exposed region with an alkali solution (a developing step),
5. hardening (setting) the resist in a non-exposed region (pattern portion) by heating (a post-baking step),
6. dipping the structure fabricated so far in an etching solution or exposing the structure fabricated so far in etching gas to remove the thin-film layer in the region without the resist (an etching step), and
7. removing the resist with an alkali solution or oxygen group (a resist removing step).

After the desired thin films are formed, the above steps are repeated to complete fabrication of an electric device.

However, the photolithographic process requires expensive equipment and involves complicated fabricating steps, and thus has a long fabrication time period. These result in high fabrication cost.

In order to reduce the fabrication cost, recently, it has been attempted to form an electrode pattern by printing, such as inkjet printing. Since the electrode pattern can be directly written when using the inkjet printing, material utilization is high, and it is possible to simplify the fabrication process and reduce the cost. However, it is difficult to reduce the amount of ejected ink in the inkjet printing, and if further considering ink positioning precision, which is associated with mechanical tolerance, it is difficult to form a pattern having a dimension less than 30 μm. As a result, it is difficult to fabricate a highly precise device, like a transistor having a short channel length, with only the inkjet printing. Therefore, in order to fabricate a highly precise device, it is necessary to develop new methods, for example, it may be tried to process the surface of the substrate on which ink droplets are ejected.

For example, Japanese Laid Open Patent Application No. 2006-278534 (referred to as reference 1 below) discloses a technique of laminating films on a gate insulating film with the films formed from materials having different surface free energy levels adjusted by ultraviolet rays. According to this technique, the electrode pattern is formed on the laminated films by inkjet printing after regions having different surface free energy levels are formed by ultraviolet rays.

However, since a region having high surface free energy and a region having low surface free energy are on the same plane and separated by a boundary on the same plane, for example, when the inkjet ejection speed is high, the ink may spread over the boundary; this causes undulation of the boundary between the region having high surface free energy and the region having low surface free energy, and causes the channel length not to be clearly defined. As a result, properties of the electronic device may fluctuate.

That is, in the technique disclosed in reference 1, since the boundary between the region having high surface free energy and the region having low surface free energy is a one-dimensional line on the same plane, for example, when the inkjet ejection speed is high, the ink may spread over the boundary; this causes the channel length not to be clearly defined, and causes fluctuations of the properties of the electronic device.

For example, Japanese Laid Open Patent Application No. 2003-518332 (referred to as reference 2 below) discloses a technique of forming a three-dimensional boundary, which can be used to solve this problem. According to this technique, a polyimide bank is formed that has low surface free energy; hence the region having high surface free energy and the region having low surface free energy are not on the same plane. As a result, hydrophilic ink ejected in the region having high surface free energy is stopped by the bank, and thus the channel length is well defined.

The technique disclosed in reference 2 is superior in that the boundary between the region having high surface free energy and the region having low surface free energy is well defined by a height difference and the region having high surface free energy and the region having low surface free energy are clearly separated. However, this technique involves formation of the bank, and in order to form the bank, it is required to use the photolithographic technique which includes complicated fabricating steps, and results in high fabrication cost; consequently, advantages of fabrication of electronic devices with printing process (for example, inkjet process) are reduced.

For example, Japanese Laid Open Patent Application No. 2004-141856 (referred to as reference 3 below) discloses a technique of forming an indent instead of a bank. According to this technique, it is not required that ink droplets ejected by inkjet perfectly stop on a surface; excessive ink may spread to an indent portion, and still a well defined boundary can be formed.

The technique disclosed in reference 3 is superior in that the line able to satisfactorily stop ink is defined by an indent. However, this technique involves formation of the indent, and in order to form the indent, it is required to use the photolithographic technique which includes complicated fabricating steps and results in high fabrication cost. Consequently, advantages of fabrication of electronic devices with printing processes (for example, inkjet process) are reduced.

As described above, in the related art, a region having high surface free energy and a region having low surface free energy are formed to shorten the channel length of a thin film transistor. However, a boundary able to well separate the region having high surface free energy and the region having low surface free energy cannot be obtained, and this causes fluctuations of the properties of the electronic device. Although some methods are proposed to solve this problem, these methods require the photolithographic technique, and thus result in a complicated fabricating process and high fabrication cost, which is contrary to advantages of technique of fabricating electronic devices with printing process.

As described above, in the related art, the photolithographic technique is frequently used to form interconnection patterns in semiconductor devices and electronic circuits. Since photolithography requires expensive equipment and involves complicated fabricating processes, and thus needs a long fabrication time period, the fabrication cost increases.

In order to reduce the fabrication cost, recently, another technique of forming interconnection patterns has been attracting attention in which disperse liquid including metal particles (this liquid is referred to as "metal particle disperse liquid" below) is directly applied to a substrate.

For example, Japanese Laid Open Patent Application No. H03-281783 (referred to as reference 4 below) discloses a technique in which metal ultrafine particles of a diameter from 0.001 μm to 0.1 μm are uniformly and highly dispersed in an organic solvent to form a metal paste, the metal paste is applied on a surface of a substrate, and is dried and baked, thus forming a metal film having a thickness of 0.01 to 1 μm. Such kind of metal ultrafine particles is also called "nano-metal ink".

However, an interconnection pattern formed from a metal particle disperse liquid, which is obtained by dispersing the nano-metal ink, namely, the metal ultrafine particles, in water or an organic solvent, has low adhesiveness to an underlying substrate compared to interconnection patterns formed by evaporation or sputtering of the related art. In addition, an electrode formed from the metal particle disperse liquid, which can be used for coating or liquid droplet ejection, is also required to have high patterning accuracy along with more and more reduced size of thin film transistors, and the adhesiveness also becomes an important issue.

Japanese Laid Open Patent Application No. 2005-159143 (referred to as reference 5 below) discloses a technique of forming an interconnection pattern by the liquid droplet ejection, which interconnection pattern is miniaturized and has good adhesiveness to a surface of a substrate. According to this technique, the interconnection pattern is formed in a region having projection and depression obtained by roughening a surface of a substrate through dry etching, frost treatment, or sandblasting which are well known in the semiconductor field related art.

However, in this technique, the projections and depressions are formed not only on the region where the interconnection pattern is formed, but also on a functional thin film which assumes the projection and depression shape of the surface of the region of the interconnection pattern; due to this, when a thin film transistor has a bottom-gate structure, the projections and depressions remain on the surface of the gate electrode, and this reduces the dielectric strength voltage and degrades the surface property of the gate insulating film formed on the gate electrode. As a result, when forming pentacene or other organic crystalline semiconductor material structures, mobility may decrease.

Japanese Laid-Open Patent Application No. 2006-114579 (referred to as reference 6 below) and Japanese Laid-Open Patent Application No. 2007-043131 (referred to as reference 7 below) disclose a technique of forming an intermediate layer between a conductive layer and an underlying layer for improving adhesiveness, which conductive layer is formed from metal particle disperse liquid including metal particles.

However, this technique involves an additional step of forming the intermediate layer, and this is contrary to the advantages of the technique of applying the metal particle disperse liquid including metal particles to a substrate directly, such as low cost and a fewer fabricating steps.

Japanese Laid-Open Patent Application No. 2003-315813 (referred to as reference 8 below) discloses a technique in which, before disposing a first liquid material including metal particles on a substrate by liquid droplet ejection means to form a conductive film interconnection having a predetermined pattern on the substrate, the surface of the substrate is controlled to be repellent to the liquid material, and a second liquid material different from the first liquid material is disposed on the substrate by the liquid droplet ejection means to form an intermediate layer for improving adhesiveness of the conductive film interconnection to the substrate.

However, by patterning utilizing liquid repellency of the substrate, it is difficult to attain sufficient adhesiveness. In addition, this technique involves an additional step of forming the intermediate layer, and this is contrary to the advantages of the technique of applying the metal particle disperse liquid including metal particles to a substrate directly, such as low cost, and fewer fabricating steps.

Japanese Laid-Open Patent Application No. 2007-012590 (referred to as reference 9 below) discloses a technique of improving adhesiveness. In this technique, after metal particle disperse liquid, which includes metal particles, water, and a solid dispersant (or dispersing agent) having a molecular weight of 2000 to 30000 and in a solid state at a room temperature, is applied on a surface of a substrate; a metal film is formed by using metal particles formed from an alloy including one or more of Ag, Au, Pt, Pd, Ru, Ir, Sn, Cu, Ni, Fe, Co, Ti, and In, in which alloy the atomic concentration of Ag is 80 to 99.9%, and an average crystal particle diameter is 0.25 µm. In this way, adhesiveness of the substrate on the coating material side is improved.

However, when forming a miniaturized interconnection, it is desirable that both the adhesiveness of the substrate on the coating material and the adhesiveness of the substrate on the side having a structure be secured, and thereby higher adhesiveness be obtained.

As described above, in the related art, although the technique of forming an interconnection pattern (conductive layer) by using the metal particle disperse liquid is proposed, there are problems in that the adhesiveness of the interconnection pattern to a substrate is not sufficient and semiconductor properties are degraded. In addition, although additional techniques are proposed to solve these problems, these techniques increase the number of fabricating steps and result in high fabrication cost.

DISCLOSURE OF THE INVENTION

The present invention may solve one or more of the problems of the related art.

A preferred embodiment of the present invention may provide a laminate structure in which a region having high surface free energy and a region having low surface free energy are well separated, and which can be formed easily at low cost.

Another preferred embodiment of the present invention may provide a laminate structure having high adhesiveness between an underlying layer and a conductive layer on the underlying layer, and able to be formed easily at low cost.

According to a first aspect of the present invention, there is provided a laminate structure, comprising:
  a wettability-variable layer including
  a first surface free energy region that has a first film thickness, and
  a second surface free energy region that has a second film thickness, the second film thickness being less than the first film thickness and a surface free energy of said second surface free energy region being higher than a surface free energy of the first surface free energy region by applying a predetermined amount of energy on said second surface free energy region; and
  a conductive layer formed in the second surface free energy region of the wettability-variable layer.

Preferably, the laminate structure comprises:
  the wettability-variable layer including
  the first surface free energy region that has the first film thickness, and
  the second surface free energy region that has the second film thickness, the surface free energy of said second surface free energy region being made higher than the surface free energy of the first surface free energy region by applying the predetermined amount of energy on said second surface free energy region, said second surface free energy region having a groove along a boundary between the first surface free energy region and the second surface free energy region; and
  the conductive layer formed on the second surface free energy region of the wettability-variable layer.

Preferably, the laminate structure comprises:
  the wettability-variable layer including
  the first surface free energy region, and
  the second surface free energy region that has the surface free energy made higher than the surface free energy of the first surface free energy region by applying the predetermined amount of energy on said second surface free energy region, wherein a plurality of depressions is formed on a surface of said second surface free energy region; and
  the conductive layer formed on the second surface free energy region of the wettability-variable layer.

Preferably, a difference between the second film thickness of the second surface free energy region and the first film thickness of the first surface free energy region is greater than or equal to 5 nm, and is less than or equal to 10% of the first film thickness.

Preferably, the wettability-variable layer includes a first material and a second material,
  an electrical insulating property of the first material is better than the electrical insulating property of the second material, and
  an increase rate of the surface free energy of the second material caused by applying a predetermined amount of energy is greater than an increase rate of the surface free energy of the first material caused by applying the predetermined amount of energy.

Preferably, the second material is formed of a polymer having a hydrophobic group on a side chain.

Preferably, the polymer includes polyimide.

Preferably, the wettability-variable layer is formed of a blend material including
  a polyimide having a main chain and a side chain, said side chain controlling wettability and resulting in low surface free energy before energy application; and
  a polyimide having a main chain only.

Preferably, the wettability-variable layer is formed of a blend material including
  a polyamic acid that is a precursor of a polyimide having a main chain and a side chain, said side chain controlling wettability and resulting in low surface free energy before applying energy; and
  a polyamic acid that is a precursor of a polyimide having a main chain only.

According to a second aspect of the present invention, there is provided an electronic device, comprising:
  a substrate;
  an electrode;
  a semiconductor layer; and
  an insulating layer,
  wherein
  the electrode, the semiconductor layer, and the insulating layer are formed on the substrate,
  the electrode includes a laminate structure which has
    a wettability-variable layer including a first surface free energy region that has a first film thickness, and a second surface free energy region that has a second film thickness, the second film thickness being less than the first film thickness and a surface free energy of said second surface free energy region being higher than a surface free energy of the first surface free energy region by applying a predetermined amount of energy on said second surface free energy region, and
    a conductive layer formed in the second surface free energy region of the wettability-variable layer.

Preferably, plural of the laminate structures are stacked with the insulating layer in between.

Preferably, the wettability-variable layer of each of the laminate structures acts as the insulating layer.

Preferably, a plurality of the electronic devices are arranged on the substrate.

According to a third aspect of the present invention, there is provided a display device, comprising:
a substrate;
an electronic device array having a plurality of electronic devices arranged on the substrate;
an opposite substrate; and
a display unit,
wherein
each of the electronic devices includes
an electrode;
a semiconductor layer; and
an insulating layer,
wherein
the electrode, the semiconductor layer, and the insulating layer are formed on the substrate,
the electrode includes a laminate structure which has
a wettability-variable layer including a first surface free energy region that has a first film thickness, and a second surface free energy region that has a second film thickness, the second film thickness being less than the first film thickness and a surface free energy of said second surface free energy region being higher than a surface free energy of the first surface free energy region by applying a predetermined amount of energy on said second surface free energy region, and
a conductive layer formed in the second surface free energy region of the wettability-variable layer.

According to the laminate structure of the present invention, it is possible to provide a laminate structure able to be formed easily at low cost and including a region having high surface free energy and a region having low surface free energy that are well separated.

In addition, it is possible to provide a laminate structure having high adhesiveness between an underlying layer and a conductive layer on the underlying layer, and able to be formed easily with low cost.

These and other objects, features, and advantages of the present invention will become more apparent from the following detailed description of preferred embodiments given with reference to the accompanying drawings.

BEST MODE FOR CARRYING OUT THE INVENTION

Below, preferred embodiments of the present invention are explained with reference to the accompanying drawings.

First Embodiment

Figure 1:
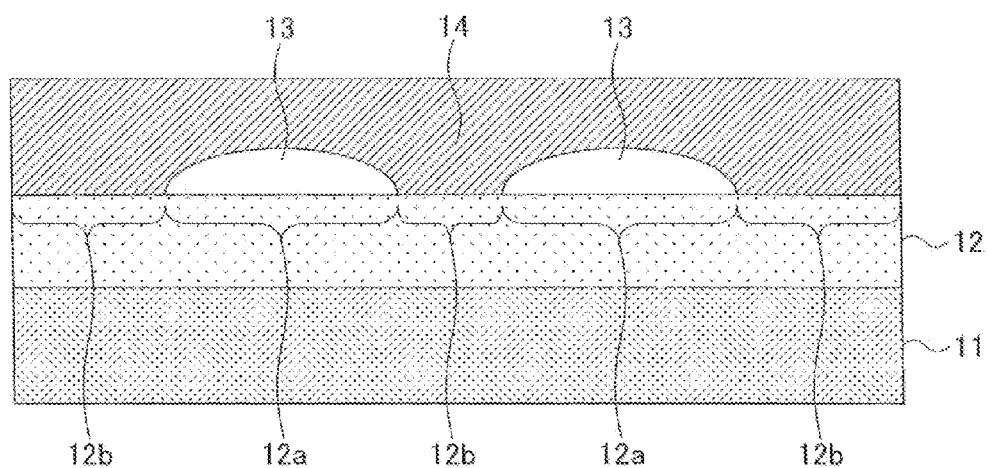
FIG. 1 is a cross-sectional view of a laminate structure according to a first embodiment of the present invention.

FIG. 1 is a cross-sectional view of a laminate structure according to a first embodiment of the present invention.

As shown in FIG. 1, a laminate structure of the present embodiment includes a substrate 11, a wettability-variable layer 12, conductive layers 13, and a semiconductor layer 14. The wettability-variable layer 12 includes high surface free energy regions 12a and low surface free energy regions 12b. The high surface free energy regions 12a and the low surface free energy regions 12b correspond to the second surface free energy region and the first surface free energy region in claims of the present application, respectively.

The substrate 11 and the wettability-variable layer 12 on the substrate 11 constitute a core portion of the laminate structure as shown in FIG. 1.

Here, the wettability-variable layer 12 is formed of materials having critical surface tension that changes when energy is applied thereon by heating, or by using ultraviolet rays, electron beams, plasma, or others; the wettability-variable layer 12 includes at least two regions having different critical surface tension. The critical surface tension is also referred to as "surface free energy". In FIG. 1, the high surface free energy regions 12a have relatively high critical surface tension (surface free energy), and the low surface free energy regions 12b have relatively low critical surface tension (surface free energy).

From the point of view of fabricating miniaturized patterns, it is preferable that energy application be performed by using ultraviolet rays or an electron beam. Nevertheless, when the material of the wettability-variable layer 12 is organic, it is preferable to use ultraviolet rays since the electron beam may greatly damage the organic material.

In addition, there is a gap between two adjacent high surface free energy regions 12a, for example, the gap is 1 μm to 5 μm. Further, the conductive layers 13 are formed on the corresponding high surface free energy regions 12a, and the semiconductor layer 14 is arranged to at least have contact with the low surface free energy regions 12b.

In the present embodiment, it is preferable that the high surface free energy regions 12a and the low surface free energy regions 12b be formed of the same material. In addition, it is preferable that the high surface free energy regions 12a and the low surface free energy regions 12b be formed of a material the surface free energy of which is low without being irradiated by ultraviolet rays but is high after being irradiated by ultraviolet rays. With the high surface free energy regions 12a and the low surface free energy regions 12b formed of the same material, it is possible to greatly simplify the fabricating process and reduce material expenses, and thus, it is possible to provide an electronic device at low cost.

Figure 2:
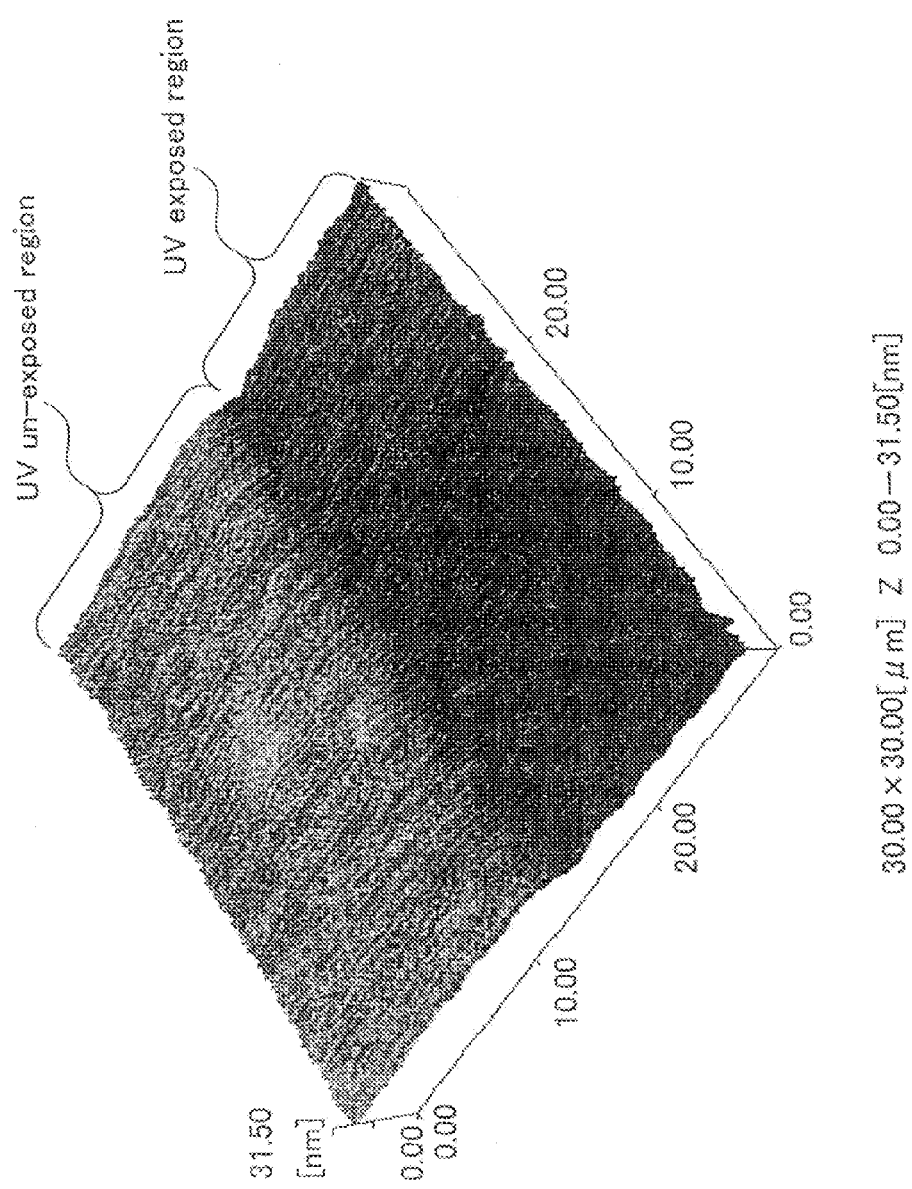
FIG. 2 shows an atomic force microscope photograph of the surface of the wettability-variable layer in the first embodiment exposed by ultraviolet rays having a dose of 10 J/cm$^2$.

It should be noted that although the surface of the wettability-variable layer 12 is illustrated to be flat in the laminate structure as shown in FIG. 1, as described below, when irradiating ultraviolet rays on the regions 12a to apply energy on the regions 12a so that the regions 12a become high surface free energy regions, the thickness of the high surface free energy regions 12a is reduced more or less, as illustrated in FIG. 2.

FIG. 2 shows an atomic force microscope photograph of the surface of the wettability-variable layer in the present embodiment exposed by ultraviolet rays having a dose of 10 J/cm$^2$.

As shown in FIG. 2, because of the reduction of the thickness of the high surface free energy regions 12a, a height difference (step) occurs on the boundary between the high surface free energy regions 12a and the low surface free energy regions 12b, thereby, forming a bank on the boundary.

That is, the laminate structure as shown in FIG. 1 comprises the wettability-variable layer 12 which includes the low surface free energy regions 12b of a first film thickness and the high surface free energy regions 12a of a second film thickness. The second film thickness becomes less than the first film thickness and the surface free energy of the high surface free energy regions 12a becomes higher than the surface free energy of the low surface free energy regions 12b when a predetermined amount of energy is applied on the regions 12a. The laminate structure as shown in FIG. 1 further comprises conductive layers 13 formed in the high surface free energy regions 12a of the wettability-variable layer 12.

Figure 3:
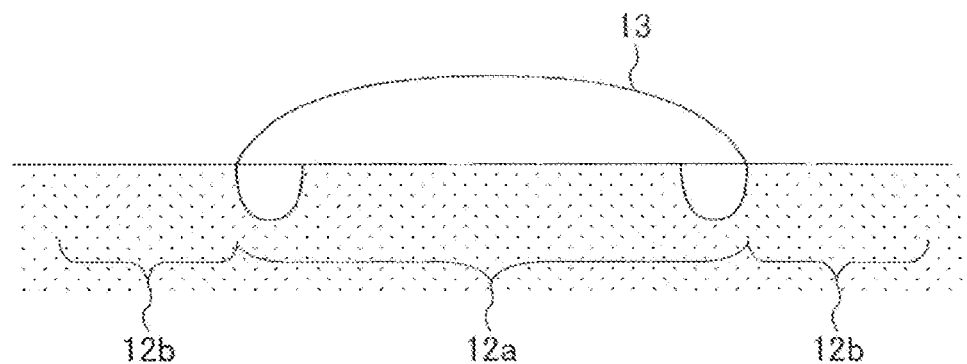
FIG. 3 is an enlarged cross-sectional view illustrating the boundary between the high surface free energy regions 12a and the low surface free energy regions 12b.

FIG. 3 is an enlarged cross-sectional view illustrating the boundary between the high surface free energy regions 12a and the low surface free energy regions 12b.

As shown in FIG. 3, grooves are formed in the high surface free energy regions 12a along the boundaries between the high surface free energy regions 12a and the low surface free energy regions 12b.

Note that in FIG. 3, the components are enlarged especially in the thickness direction for illustrative purposes.

Figure 4:
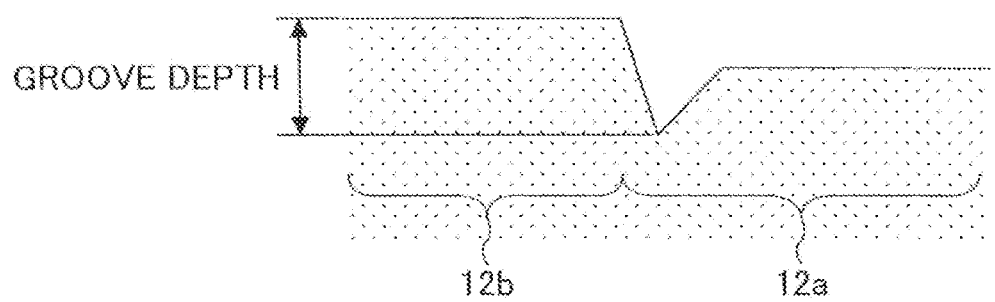
FIG. 4 is an enlarged cross-sectional view illustrating the step (groove) portion in FIG. 2 and FIG. 3.

FIG. 4 is an enlarged cross-sectional view illustrating the step (groove) portion in FIG. 2 and FIG. 3.

As shown in FIG. 4, there is a step between the high surface free energy region 12a and the low surface free energy region 12b, and a groove is formed in the high surface free energy region 12a (region exposed by ultraviolet rays) along the boundary between the high surface free energy region 12a (region exposed by ultraviolet rays) and the low surface free energy region 12b (region not exposed by ultraviolet rays).

Because of the combination of the step between the high surface free energy region 12a and the low surface free energy region 12b and the groove in the high surface free energy region 12a along the boundary between the high surface free energy region 12a and the low surface free energy region 12b, it is possible to prevent ink droplets landing in the high surface free energy regions 12a from spreading to the low surface free energy regions 12b.

As shown in FIG. 4, since there is the step between the high surface free energy region 12a and the low surface free energy region 12b, the depth of the groove, which is formed in the high surface free energy region 12a, is defined with the low surface free energy region 12b as a reference.

Hydrophilic ink droplets ejected by inkjet arrive at and spread on the high surface free energy regions 12a, which constitute hydrophilic surfaces. In the related art, the high surface free energy regions 12a and the low surface free energy regions 12b are on the same plane, and spreading of ink droplets is prevented by boundaries between the high surface free energy regions 12a and the low surface free energy regions 12b, which constitute hydrophobic surfaces. In other words, spreading of ink droplets is prevented by the contrast of the hydrophilic surfaces 12a and the hydrophobic surfaces 12b.

In the present embodiment, in addition to the contrast of the hydrophilic surfaces 12a and the hydrophobic surfaces 12b, a three-dimensional bump is formed on the boundaries between the high surface free energy regions 12a and the low surface free energy regions 12b, so that it is possible to prevent the ink from spreading over the boundaries. As a result, the boundaries between the high surface free energy regions 12a and the low surface free energy regions 12b can be precisely formed as straight lines, the shapes of edges of electrode patterns can be well defined (for example, in the laminate structure as shown in FIG. 1, the shape of the edge of the conductive layers 13 is well defined), and thus, it is possible to obtain electronic devices having little fluctuation in properties. For example, when the laminate structure as shown in FIG. 1 is applied to field effect transistors, the channel length of the field effect transistors can be well defined, and this reduces fluctuation in properties of the field effect transistors.

The bump is originated from a thickness difference between the high surface free energy regions 12a and the low surface free energy regions 12b. When the height of the bump is too small, it is expected that the effect of preventing the ink spreading will be quite small. As described below, it is found through experiments that it is preferable that the height of the bump be 5 nm or more. On the other hand, when the bump is too high, reduction of the film thickness of the wettability-variable layer 12 is large; due to this, the electric insulating property may be degraded. As described below, it was found through experiments that it is preferable that the height of the bump be 10% or less of the original film thickness of the wettability-variable layer 12 prior to energy application, that is, the film thickness of the low surface free energy regions 12b.

As described below, the height of the bump can be controlled through appropriate selection of the materials and through the dose of the ultraviolet rays.

The edge of the bump (like a cliff in FIG. 2) may be of any shape, like a taper, an inversed taper, or be perpendicular, as long as ink cannot climb over the bump. Generally, when ultraviolet rays are irradiated through a photo mask having a certain pattern, the shape of the edge of the bump is determined by interference light near the pattern edge. Therefore, it is possible to change the shape of the edge of the bump by providing a slope to the thickness of the mask pattern.

In the above, it is described that the semiconductor layer 14 is arranged on the low surface free energy regions 12b in the laminate structure as shown in FIG. 1; however, the semiconductor layer 14 can be replaced by an insulating layer used for preventing leakage between electrodes. In addition, in FIG. 1, it is illustrated that the semiconductor layer 14 is formed to cover the whole substrate 11; however, the semiconductor layer 14 can be patterned to be located only between two adjacent conductive layers 13. When the semiconductor layer 14 is formed to cover the whole substrate 11, generally, spin-coating is used; but certainly, any other method can be used. When patterning the semiconductor layer 14, photolithography may be used; but inkjet (printing), micro-conduct printing, flexo printing, or gravure printing can also be used, and are superior in fabrication of electronic devices at low cost.

The substrate 11 may be a glass substrate or a film substrate. For example, the film substrate may be a polyimide (PI) substrate, a polyethersulfone (PES) substrate, a polyethylene terephthalate (PET) substrate, or a polyethylene naphthalate (PEN) substrate.

In the laminate structure as shown in FIG. 1, the wettability-variable layer 12 may be a single layer formed from plural kinds of materials, or a single layer formed from a single material.

Alternatively, the wettability-variable layer 12 may include two or more layers. In this case, for example, assume the wettability-variable layer 12 includes a first layer formed of a first material and a second layer formed of a second material, the first layer and the second layer may be formed to have different functions. For example, from the point of view of improving insulating performance, the wettability-variable layer 12 can be formed such that the electrical insulating property of the first material is better than the electrical insulating property of the second material, and the increase rate of the surface free energy of the second material caused by application of energy like ultraviolet rays is greater than the increase rate of the surface free energy of the first material.

Alternatively, the wettability-variable layer 12 may be a single layer formed of two or more materials. Assume the wettability-variable layer 12a is formed by mixing a first material and a second material; by utilizing differences of material properties of the first material and the second material, the wettability-variable layer 12 may be formed to have a material distribution in a thickness direction of the wettability-variable layer 12. For example, the wettability-variable layer 12 can be formed such that the electrical insulating property of the first material is better than the electrical insulating property of the second material, and the increase rate of the surface free energy of the second material caused by application of energy like ultraviolet rays is greater than the increase rate of the surface free energy of the first material.

The materials constituting the wettability-variable layer 12 may be organic materials or inorganic materials, but organic materials are preferable when considering suitability for the printing method, which is able to fabricate electronic devices at low cost. Further, In order to improve insulating performance, a tiny amount of inorganic materials may be added into the organic materials.

When the wettability-variable layer 12 is formed on an insulating layer, in order to prevent the insulating layer from being influenced by irradiation of ultraviolet rays, it is preferable that the wettability-variable layer 12 be formed of materials having absorption coefficients greater than that of the insulating material of the insulating layer.

Organic materials having good insulating properties include polyimide, polyamideimide, epoxy resins, silsesquioxane, poly(vinylphenol), polycarbonate, fluorine-based resins, poly para-xylylene, or polyvinyl butyral). Here, poly (vinylphenol) and poly(vinylalcohol) may be bridged by appropriate cross-linking agents.

Inorganic materials having good insulating properties may include TiO2, SiO2, and others.

It is preferable that polymer materials be used as the materials having relatively large increase rate of the surface free energy caused by energy application, like ultraviolet rays when using the printing method, which is suitable for fabricating devices at low cost. In addition, it is preferable that the polymer materials have a hydrophobic group on a side chain. Because of the hydrophobic group on the side chain, the surface free energy of the film is low when ultraviolet rays are not irradiated, and the surface free energy of the film becomes high after ultraviolet rays are irradiated to apply energy; hence, it is possible to obtain a large difference between the surface free energy before ultraviolet irradiation and the surface free energy after ultraviolet irradiation, that is, it is possible to increase the contrast between of the hydrophilic surfaces 12a and the hydrophobic surfaces 12b.

In the present embodiment, since the materials having variable critical surface tension (surface free energy) have a rigid structure even when cut to some degree by the ultraviolet rays, it is preferable that polyimide, which has good filling ability, be introduced into a main chain. Polyimide includes thermal-setting polyimide, which is generated in a dehydrative condensation reaction by heating a polyamic acid, and soluble polyimide, which is soluble in a solvent.

A soluble polyimide film can be formed as below. First, a polyimide application liquid dissolved in a solvent is applied, then the solvent is volatilized at a relatively low temperature, for example, lower than 200° C., and then the soluble polyimide film is formed.

Concerning the thermal-setting polyimide, since the dehydrative condensation reaction does not occur unless the temperature is increased to be sufficiently high for the dehydrative condensation reaction, it is usually necessary to heat to 200° C. or higher. Therefore, it is preferable that the soluble polyimide be used because the soluble polyimide has high insulating properties, and allows a film having solvent-resistance to be formed at a low temperature. Since the soluble polyimide does not produce un-reacted polyamic acid or dianhydride of other by-products, degradation of electric properties of polyimide caused by these impurities does not occur.

The soluble polyimide is soluble in, for example, γ-butyrolactone, N-Methylpyrrolidone, and N-Dimethyl acetamide, which have high polarity. For this reason, when forming the semiconductor layer 14 on the wettability-variable layer 12, erosion of the wettability-variable layer 12 by the solvent is preventable if solvents having low polarity are used, such as toluene, xylene, acetone, and isopropyl alcohol.

In the present embodiment, preferably, the thickness of the wettability-variable layer 12 is from 30 nm to 3 μm, more preferably, from 50 nm to 1 μm. When the wettability-variable layer 12 is too thin, bulk properties of the wettability-variable layer 12 may be degraded, such as insulating performance, gas-barrier ability, and humidity-resistance. On the other hand, when the thickness of the wettability-variable layer 12 is greater than 3 μm, the surface shape of the wettability-variable layer 12 may be degraded.

The semiconductor layer 14 may be formed of inorganic semiconductors like CdSe, CdTe, or Si, or formed from organic semiconductors such as organic low molecules like pentacene, anthracene, tetracene, or phthalocyanine, polyacetylene-based conductive polymers, polyphenylene-based conductive polymers like poly(p-phenylene) and its derivatives, poly(phenylenevinylene) and its derivatives, heterocyclic conductive polymers, like polypyrrole and its derivatives, polythiophene and its derivatives, polyfuran and its derivatives, or ionic conductive polymers like polyaniline and its derivatives.

In order that the effect of property improvement by the wettability-variable layer 12 is remarkable, it is preferable that the semiconductor layer 14 be formed of organic semiconductors.

The conductive layers 13 can be formed by applying liquid including conductive materials, and then heating the applied liquid and irradiating the applied liquid with ultraviolet rays. The liquid including the conductive materials may be a solution obtained by dissolving the conductive materials in a solvent, a solution obtained by dissolving precursors of the conductive materials in a solvent, a solution obtained by dispersing the conductive materials in a solvent, or a solution obtained by dispersing the precursors of the conductive materials in a solvent, such as a disperse liquid obtained by dispersing Ag, Au, Ni and other metal particles in an organic solvent or water, a water solution of doped PANI (polyaniline), or a water solution of conductive polymers obtained by doping PSS (poly(styrenesulfonate)) in PEDOT (poly (ethylenedioxythiophene).

The liquid including conductive materials can be applied on the surface of the wettability-variable layer 12 by spin-coating, dip coating, screen printing, offset printing, or inkjet. In order to be easily affected by the surface free energy of the wettability-variable layer 12, it is preferable to use inkjet because inkjet supplies very small liquid droplets. When using a head of a common printer, image resolution of inkjet is about 30 μm and positioning precision is ±15 μm. When utilizing differences of the surface free energy of the wettability-variable layer 12, patterns much finer than this pattern can be formed. The present embodiment has advantages over the prior art especially when it is required to form fine patterns.

Figure 5A:
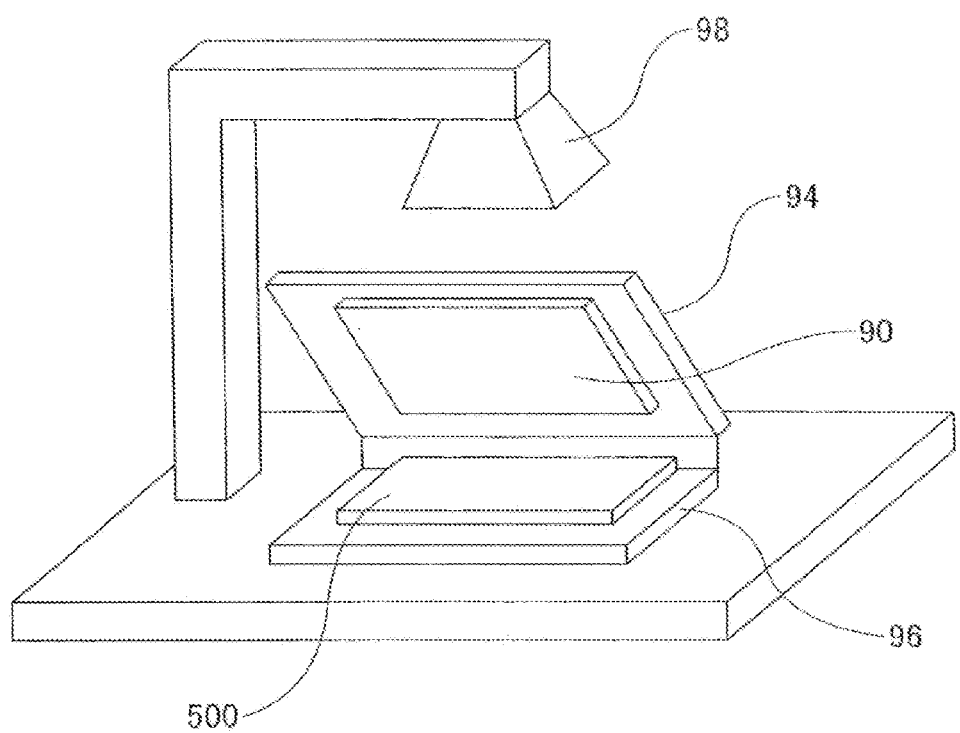
FIG. 5A and FIG. 5B are perspective views illustrating ultraviolet irradiation devices according to the first embodiment.
Figure 5B:
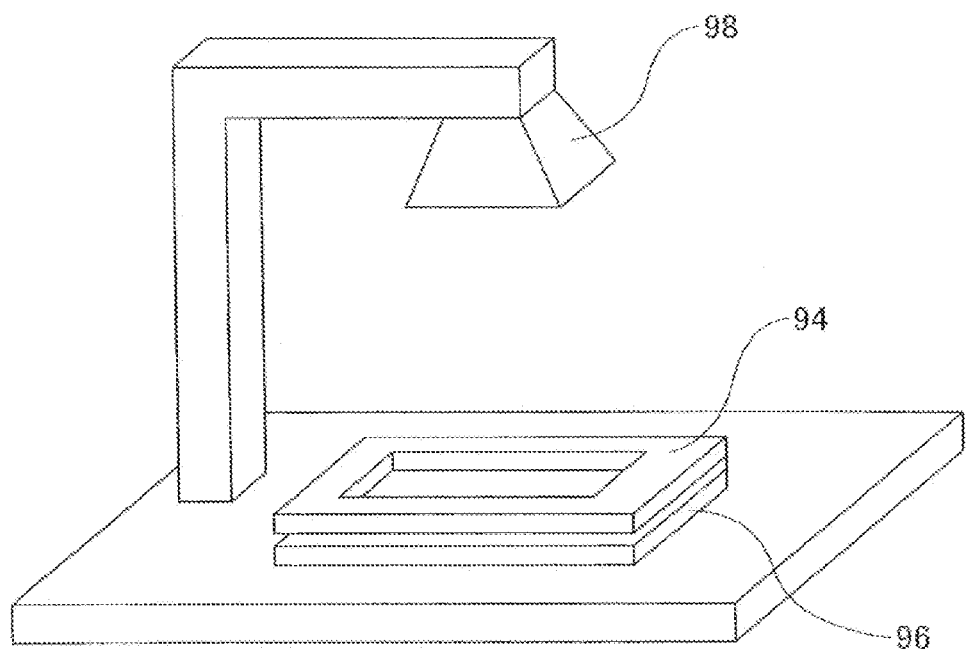

Irradiation of ultraviolet rays can be carried out with devices illustrated in FIG. 5A and FIG. 5B.

FIG. 5A and FIG. 5B are perspective views illustrating ultraviolet irradiation devices according to the present embodiment.

Each of the ultraviolet irradiation devices shown in FIG. 5A and FIG. 5B includes a photo-mask holder 94, a substrate stage 96, and an ultraviolet light source 98. In the ultraviolet irradiation device shown in FIG. 5A, there are shown a photo-mask 90 and a substrate 500 set in the ultraviolet irradiation device. Each of the ultraviolet irradiation devices shown in FIG. 5A and FIG. 5B further includes a not-shown mechanism for opening and closing the photo-mask holder 94, and a not-shown driving mechanism for adjusting the angle and relative position between the photo-mask 90 and the substrate 500.

In the ultraviolet irradiation devices shown in FIG. 5A and FIG. 5B, first, the photo-mask 90 is set in the photo-mask holder 94, the substrate 500 is set in the substrate stage 96, and the photo-mask 90 and the substrate 500 are fixed to the photo-mask holder 94 and the substrate stage 96 by a not shown adsorption mechanism. As shown in FIG. 5A, the photo-mask 90 and the substrate 500 are fixed to the ultraviolet irradiation device.

Next, the photo-mask holder 94 is closed so that the photo-mask 90 and the substrate 500 are brought to face each other. As shown in FIG. 5B, the photo-mask holder 94 of the ultraviolet irradiation device is closed. After the photo-mask holder 94 is closed, the driving mechanism moves the substrate stage 96 or the photo-mask holder 94 to adjust the angle and relative position between the photo-mask 90 and the substrate 500. After the adjustment, the photo-mask 90 and the substrate 500 are exposed to ultraviolet rays from the ultraviolet light source 98 to a preset dose. During the exposure to ultraviolet rays, the photo-mask 90 and the substrate 500 may be brought into close contact with each other, or a small gap may be provided between the photo-mask 90 and the substrate 500 (the so-called "proximity exposure"). After the exposure to ultraviolet rays at the preset dose, the photo-mask holder 94 is opened to release the adsorption mechanism of the substrate 500 and remove the substrate 500.

According to the present embodiment, in the laminate structure of the present embodiment, a step (height difference) occurs on the boundaries between the low surface free energy regions 12b (the first surface free energy regions) and the high surface free energy regions 12a (the second surface free energy regions), which have surface free energy higher than that of the low surface free energy regions 12b and are thinner than the low surface free energy regions 12b because of energy application on the regions 12a by ultraviolet rays, and the height of the steps corresponds to the height difference between the low surface free energy regions 12b and the high surface free energy regions 12a. As a result, the border lines between the low surface free energy regions 12b and the high surface free energy regions 12a are clearly defined.

Further, in the present embodiment, the laminate structure having such clearly defined border lines can be formed by inkjet or other inexpensive methods, and it is not necessary to use the photolithographic process which requires expensive equipment and involves complicated fabricating steps. Consequently, the laminate structure of the present embodiment can be fabricated at lost cost.

In the laminate structure of the present embodiment, the wettability-variable layer includes a first material and a second material, the electrical insulating property of the first material is better than electrical insulating property of the second material, and an increase rate of the surface free energy of the second material caused by energy application is greater than an increase rate of the surface free energy of the first material caused by energy application.

Due to this, the border lines between the low surface free energy regions 12b and the high surface free energy regions 12a are clearly defined, and the laminate structure of the present embodiment is superior in electrical insulating property. For example, when the laminate structure of the present embodiment is applied to field effect transistors, the channel length of the field effect transistors can be well defined, there is little fluctuation in properties of the field effect transistors, and the field effect transistors are superior in electrical insulating property.

In the laminate structure of the present embodiment, the second material, which has a relatively large increase rate of the surface free energy caused by energy application, is formed of a polymer having a hydrophobic group on a side chain. Due to this, it is possible to change the surface free energy by applying a small amount of energy.

For example, the polymer having a hydrophobic group on a side chain may be a polymer including polyimide. With this material, even when ultraviolet rays are irradiated to apply energy it is possible to sustain the insulating property of the laminate structure.

The present embodiment may provide an electronic device including a substrate, an electrode, a semiconductor layer, and an insulating layer, in which the electrode, the semiconductor layer, and the insulating layer are formed on the substrate. The electrode is formed by the laminate structure as described above.

As a result, the border lines between the low surface free energy regions 12b and the high surface free energy regions 12a are clearly defined, and the shapes of edges of electrode patterns are well defined; thus, it is possible to obtain electronic devices having little fluctuation in properties. For example, when the laminate structure of the present embodiment is applied to field effect transistors, the channel length of the field effect transistors are well defined, and this reduces fluctuations in properties of the field effect transistors.

In the electronic device of the present embodiment including the laminate structure of the present embodiment, because the semiconductor layer is formed of organic semiconductor materials, the electronic device can be fabricated at low cost by inexpensive methods like printing.

Since the electronic device of the present embodiment using the laminate structure of the present embodiment has a stack structure of a gate insulating film and the laminate structure, it is possible to sustain the insulating property of the laminate structure even when ultraviolet rays are irradiated to apply energy.

In the electronic device of the present embodiment using the laminate structure of the present embodiment, since the wettability-variable layer 12 also serves as an insulating film to realize functions of an insulating film, it is possible to provide an electronic device, like a thin film transistor, having high performance at low cost.

In the electronic device of the present embodiment, since the laminate structure of the present embodiment is used in plural electrode layers, all electrodes of an electronic device, like a thin film transistor, can have high precision and high density.

EXAMPLE 1

An experiment was performed to study an appropriate range of the value of the height difference (the step) between the low surface free energy regions and the high surface free energy regions.

In this example, an NMP (N-methyl-2-pyrrolidone) solution of polyimide, which has a hydrophobic group on a side chain and the surface free energy of which changes due to energy application by ultraviolet rays irradiation, is applied on a glass substrate by spin-coating. After the substrate is pre-heated in an oven at a temperature of 100° C., the solvent is removed at a temperature of 180° C. to form the wettability-variable layer. Then, ultraviolet rays having a wavelength less than 300 nm from an extra high pressure mercury lamp are irradiated onto the wettability-variable layer through a photomask having a pattern, and thereby, forming exposed regions and un-exposed regions on the same surface of the wettability-variable layer.

Refer to FIG. 2, which shows an atomic force microscope photograph of the surface of the wettability-variable layer in the present embodiment exposed by ultraviolet rays having a dose of 10 J/cm².

As shown in FIG. 2, the exposed regions are the high surface free energy regions, which have a thickness less than that of the un-exposed regions (the low surface free energy regions). Therefore, the thickness of the high surface free energy regions is reduced due to exposure of ultraviolet rays.

Next, dependence of the thickness difference between the high surface free energy regions (regions exposed by ultraviolet rays) and the low surface free energy regions (regions not exposed by ultraviolet rays), namely, the average height difference between the high surface free energy regions and the low surface free energy regions, on ultraviolet exposure time period (ultraviolet exposure dose) is measured by using an atomic force microscope.

Table 1 shows the dependence of the thickness difference on ultraviolet exposure dose.

Measurement results summarized in Table 1 also include contact angles of nano-silver ink in the regions exposed by ultraviolet rays.

Measurements are also made of stopping conditions of ink droplets on the boundary between the high surface free energy regions (regions exposed by ultraviolet rays) and the low surface free energy regions (regions not exposed by ultraviolet rays) when nano-silver ink is ejected from an inkjet onto the high surface free energy regions. The measurement results are shown in Table 1.

TABLE 1

| UV Dose [J/cm²] | Nano Silver Ink Contact Angle [°] | Average Height Difference [nm] | Ink Droplet Stopping Condition |
|---|---|---|---|
| 0 | 28 | 0 | X |
| 2 | 27 | 0 | X |
| 3 | 26 | 2.1 | X |
| 5 | 16 | 5.0 | Δ |
| 7 | 6 | 9.5 | ◎ |
| 10 | 6 | 14.0 | ◎ |
| 20 | 5 | 31.3 | ◎ |
| 30 | 5 | 48.4 | ◎ |
| 40 | 5 | 65.4 | ◎ |

◎: Very Good, Δ: Good, X: Bad

As shown in Table 1, when the exposure dose of the ultraviolet rays increases, the average height difference between the high surface free energy regions (regions exposed by ultraviolet rays) and the low surface free energy regions (regions not exposed by ultraviolet rays) also increases; hence, it is possible to realize any height difference as desired by changing the exposure dose of the ultraviolet rays.

On the other hand, when the exposure dose of the ultraviolet rays increases, the contact angle of nano-silver ink decreases so that the originally hydrophobic regions exposed to ultraviolet rays become hydrophilic. When the exposure dose of the ultraviolet rays is less than 5 J/cm², the average height difference is small, and the liquid droplets spread over the border lines between the exposed regions and the un-exposed regions; thus, the exposed regions and the un-exposed regions cannot be clearly distinguished.

When the exposure dose of the ultraviolet rays is 5 J/cm², after landing of the liquid droplets, although part of the liquid droplets spreads over the border lines, quite many liquid droplets stay in the exposed regions.

When the exposure dose of the ultraviolet rays is equal to or greater than 7 J/cm², all of the liquid droplets completely stay in the exposed regions (high surface free energy regions), and there is no liquid droplet spreading to the un-exposed regions (low surface free energy regions). When the exposure dose of the ultraviolet rays is equal to or greater than 7 J/cm², the contact angle of nano-silver ink is about 5°, and the film surface becomes hydrophilic; hence, the liquid droplets can easily wet the film surface and spread after landing onto the film surface. However, because of the thickness difference on the border line between the high surface free energy regions (regions exposed by ultraviolet rays) and the low surface free energy regions (regions not exposed by ultraviolet rays), all of the liquid droplets completely stay in the exposed regions (high surface free energy regions), and there is no liquid droplet spreading over the border line.

From the measurement results shown in Table 1, an average height difference of 5 nm is a limit for confining the liquid droplets after landing. That is, when the average height difference between the high surface free energy regions and the low surface free energy regions is equal to or greater than 5 nm, the liquid droplets can be completely confined in the high surface free energy regions after landing.

EXAMPLE 2

An experiment was performed to further study the appropriate value of the height difference (the step) between the low surface free energy regions and the high surface free energy regions.

In this example, an aluminum electrode is fabricated throughout a glass substrate by vacuum evaporation.

Next, the same material as that in example 1 is applied, and the substrate is heated in an oven at a temperature of 180° C. to form a wettability-variable layer in 400 nm. Then, ultraviolet rays of a wavelength less than 300 nm (from an extra high pressure mercury lamp) are irradiated onto the wettability-variable layer at various doses.

Next, an aluminum electrode is fabricated on the exposed substrate by vacuum evaporation through a mask pattern having a hole of a diameter of 1 mm. Then, a voltage is applied on this structure with the aluminum electrode throughout the glass substrate as a lower electrode, and the aluminum electrode having a diameter of 1 mm as an upper electrode to measure leakage currents of the wettability-variable layer (namely, currents flowing through the thickness direction of the wettability-variable layer).

Table 2 shows measurement results of dependence of the leakage current of the wettability-variable layer on the height difference between the low surface free energy regions and the high surface free energy regions.

Table 2 also presents a relative average height difference, which is defined to be a ratio of the average height difference to a 400 nm film thickness.

TABLE 2

| UV Dose [J/cm²] | Average Height Difference [nm] | Leakage Current | Ratio Of Average Height Difference To 400 nm Film Thickness [%] |
|---|---|---|---|
| 0 | 0 | ◎ | 0 |
| 2 | 0 | ◎ | 0 |
| 3 | 2.2 | ◎ | 0.5 |
| 5 | 5.1 | ◎ | 1.3 |
| 7 | 9.5 | ◎ | 2.4 |
| 10 | 14.2 | ◎ | 3.5 |
| 20 | 31.2 | ◎ | 7.8 |
| 30 | 48.1 | Δ | 12.0 |
| 40 | 65.1 | X | 16.3 |

◎: Very Good, Δ: Good, X: Bad

As shown in Table 2, when the relative average height difference between the high surface free energy regions (regions exposed by ultraviolet rays) and the low surface free energy regions (regions not exposed by ultraviolet rays) is less than or equal to 7.8%, the leakage current is essentially the same as that when ultraviolet rays are not irradiated. However, when the relative average height difference exceeds 12%, the leakage current increases gradually, and when the relative average height difference arrives at 16.3%, the leakage current is very large in all samples under measurements.

Therefore, from the measurement results shown in Table 2, it is found that a relative average height difference of 12% is an upper limit for the leakage current to be tolerable.

EXAMPLE 3

The same experiment as that in example 2 was performed by using other materials to further study the appropriate value of the height difference (the step) between the low surface free energy regions and the high surface free energy regions.

In this example, the same as example 2, an aluminum electrode is fabricated throughout a glass substrate by vacuum evaporation. Next, by using materials having a different main chain molecular frame from that used in example 2, specifically, a GBL (γ-butyrolactone) solution of polyimide, which has an alkyl group on a side chain and the surface free energy of which changes due to energy application by ultraviolet rays irradiation, is applied on an underlying aluminum film by spin-coating. After the substrate is pre-heated in an oven at a temperature of 100° C., the solvent is removed at a temperature of 180° C. to form the wettability-variable layer. The film thickness is 400 nm.

Then, ultraviolet rays of a wavelength less than 300 nm (from an extra high pressure mercury lamp) are irradiated onto the wettability-variable layer at various doses. Next, an aluminum electrode is fabricated on the exposed substrate by vacuum evaporation through a mask pattern having a hole of a diameter of 1 mm. Then, a voltage is applied on this structure with the aluminum electrode throughout the glass substrate as a lower electrode, and the aluminum electrode having a diameter of 1 mm as an upper electrode to measure leakage currents of the wettability-variable layer (namely, currents conducting through the thickness direction of the wettability-variable layer).

Table 3 shows measurement results of dependence of the leakage current of the wettability-variable layer on the height difference between the low surface free energy regions and the high surface free energy regions.

Table 3 also presents a relative average height difference defined to be a ratio of the average height difference to the 400 nm film thickness.

Comparing Table 2 and Table 3, it is found that even when the exposure dose of the ultraviolet rays are the same, the average height difference can be adjusted by changing the molecular frame of materials of the wettability-variable layer.

TABLE 3

| UV Dose [J/cm²] | Average Height Difference [nm] | Leakage Current | Ratio Of Average Height Difference To 400 nm Film Thickness [%] |
|---|---|---|---|
| 0 | 0 | ◎ | 0 |
| 1 | 8.8 | ◎ | 2.2 |
| 3 | 24.9 | ◎ | 6.2 |
| 6 | 38.0 | Δ | 9.5 |
| 10 | 46.9 | X | 11.7 |

◎: Very Good, Δ: Good, X: Bad

As shown in Table 3, when the relative average height difference between the high surface free energy regions (regions exposed by ultraviolet rays) and the low surface free energy regions (regions not exposed by ultraviolet rays) is less than or equal to 6.2%, the leakage current is essentially the same as that when ultraviolet rays are not irradiated. However, when the relative average height difference exceeds 9.5%, the leakage current increases gradually, and when the relative average height difference arrives at 11.7%, the leakage current is very large in all samples under measurements.

Therefore, from the measurement results of example 2 and example 3, it is found that, independent of materials, a relative average height difference of 10% is an upper limit for the leakage current to be tolerable.

EXAMPLE 4 AND COMPARATIVE EXAMPLE 1

Figure 6:
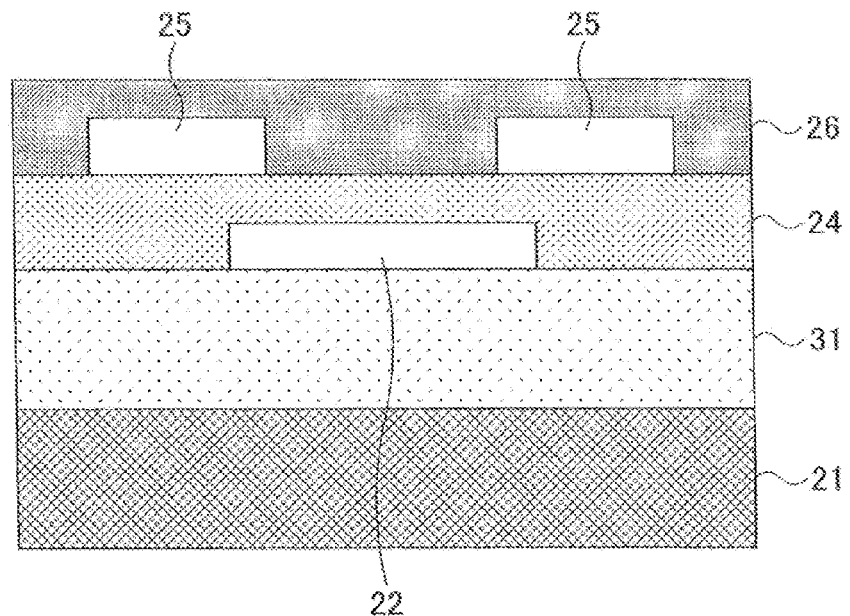
FIG. 6 is a cross-sectional view of an organic transistor according to an example 4 of the first embodiment and a comparative example 1.

FIG. 6 is a cross-sectional view of an organic transistor according to an example 4 of the present embodiment and a comparative example 1.

An organic transistor as shown in FIG. 6, which is an example of an electronic device, includes a film substrate 21, a gate electrode 22, a second wettability-variable layer 24, source-drain electrodes 25, an organic semiconductor layer 26, and a first wettability-variable layer 31.

In the example 4, ultraviolet rays of a wavelength less than 300 nm (from an extra high pressure mercury lamp) are irradiated with a dose of 10 J/cm² to form high surface free energy regions on the second wettability-variable layer 24.

In the comparative example 1, ultraviolet rays of a wavelength less than 300 nm (from an extra high pressure mercury lamp) are irradiated with a dose of 40 J/cm² to form high surface free energy regions on the second wettability-variable layer 24.

As shown in Table 2, along with an increase of the dose of the ultraviolet rays, the ratio of the average height difference to the film thickness increases.

In addition, as shown in Table 3, along with an increase of the dose of the ultraviolet rays, the leakage current increases.

with a dose of 10 J/cm² (in the example 4) or 40 J/cm² (in the comparative example 1) through a photo-mask having line-shaped patterns at intervals of 3 to form the high surface free energy regions on the second wettability-variable layer 24.

Next, by means of inkjet, nano-silver ink is ejected onto the high surface free energy regions, and the resulting structure is heated at a temperature of 180° C. to form the source-drain electrode 25.

Next, an application liquid, which is obtained by dissolving triarylamine (organic semiconductor materials) represented by the following chemical formula 1 in a mixing solvent of xylene and mesitylene, is dropped onto a channel length portion by inkjet, and is dried at a temperature of 120° C. to form the organic semiconductor layer 26 having a film thickness of 30 nm.

Therefore, an organic transistor is fabricated. In this organic transistor, the second wettability-variable layer 24 also functions as a gate insulating film.

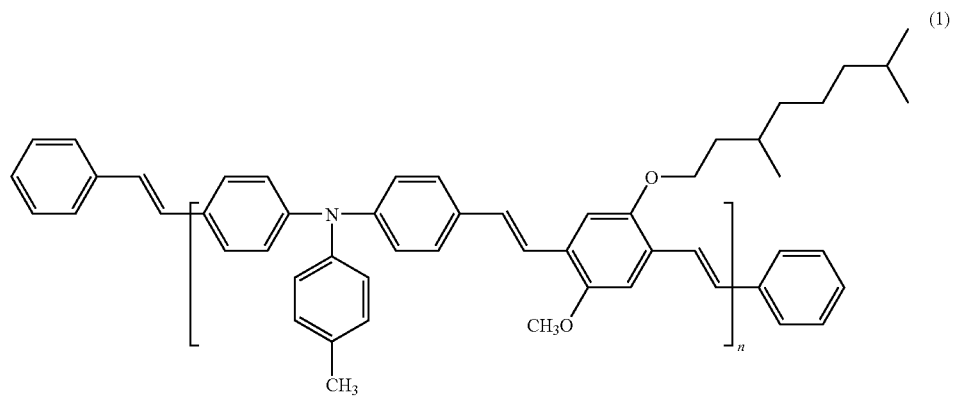

(1)

In the example 4 and the comparative example 1, influence of the exposure dose of the ultraviolet rays on transistor characteristics is studied by changing the exposure dose of the ultraviolet rays.

On the film substrate 21, as in the example 1, an NMP (N-methyl-2-pyrrolidone) solution of polyimide, which has a hydrophobic group on a side chain and the surface free energy of which changes due to energy application by ultraviolet rays irradiation, is applied on a glass substrate by spin-coating to form the first wettability-variable layer 31 having a thickness of 50 nm. Next, ultraviolet rays having a wavelength less than 300 nm from an extra high pressure mercury lamp are irradiated onto the first wettability-variable layer 31 through a photo-mask with an exposure dose of 8 J/cm² to form the high surface free energy regions on the first wettability-variable layer 31.

Next, by means of inkjet, nano-silver ink is ejected onto the high surface free energy regions, and the resulting structure is heated at a temperature of 180 C to form the gate electrode 22 having film thickness of 50 nm. On the gate electrode 22, a mixing solution of a polyimide solution PI100 (manufactured by Maruzen Petrochemical CO. LTD.) and the NMP (N-methyl-2-pyrrolidone) solution of polyimide as that used in the example 1 is applied by spin-coating and is heated at a temperature of 180° C. to form the second wettability-variable layer 24 having a thickness of 400 nm and also serving as a gate insulating film.

Next, ultraviolet rays of a wavelength less than 300 nm (from an extra high pressure mercury lamp) are irradiated In the example 4, patterning performance of the electrodes is good. Through evaluation of the transistor characteristics, it is found that in the obtained organic transistor, the on-off ratio Ion/Ioff, which is a ratio of the current in an ON state to the current in an OFF state, is over 10000, and the field effect mobility is $4 \times 10^{-3}$ cm²/V/s.

On the other hand, in the comparative example 1, the off current is large, and good transistor characteristics are not obtained. It is predicted that this is because the average height difference between the high surface free energy regions (regions exposed by ultraviolet rays) and the low surface free energy regions (regions not exposed by ultraviolet rays) exceeds 10% of the film thickness of the second wettability-variable layer 24, which also serves as a gate insulating film, and the leakage current becomes large.

EXAMPLE 5 AND COMPARATIVE EXAMPLE 2

Figure 7:
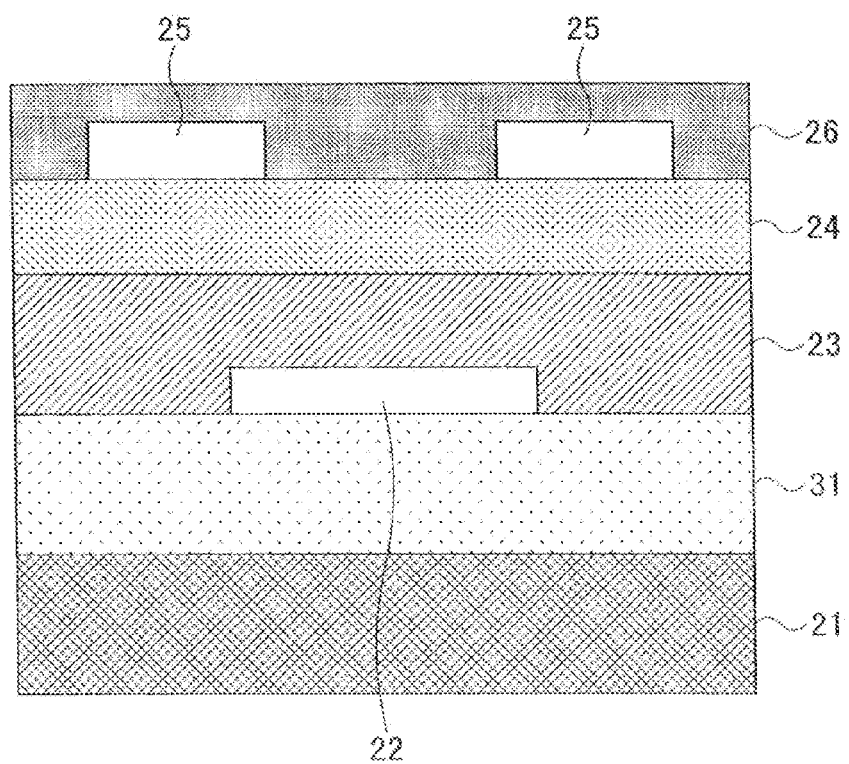
FIG. 7 is a cross-sectional view of an organic transistor according to an example 5 of the first embodiment and a comparative example 2.

FIG. 7 is a cross-sectional view of an organic transistor according to an example 5 of the present embodiment and a comparative example 2.

In FIG. 7, the same reference numbers are assigned to the same elements as those illustrated in FIG. 6.

An organic transistor as shown in FIG. 7, which is an example of an electronic device, includes a film substrate 21, a gate electrode 22, an insulating layer 23, a second wettability-variable layer 24, source-drain electrodes 25, an organic semiconductor layer 26, and a first wettability-variable layer 31.

In the example 5, ultraviolet rays of a wavelength less than 300 nm (from an extra high pressure mercury lamp) are irradiated with a dose of 8 J/cm² to form high surface free energy regions on the second wettability-variable layer 24.

In the comparative example 2, ultraviolet rays of a wavelength less than 300 nm (from an extra high pressure mercury lamp) are irradiated with a dose of 40 J/cm² to form high surface free energy regions on the second wettability-variable layer 24.

As shown in Table 2, along with an increase of the dose of the ultraviolet rays, the ratio of the average height difference to the film thickness increases.

In addition, as shown in Table 3, along with an increase of the dose of the ultraviolet rays, the leakage current increases.

In the example 5 and the comparative example 2, influence of the exposure dose of the ultraviolet rays on transistor characteristics of organic transistors having different structures from those in the example 4 and the comparative example 1 is studied by changing the exposure dose of the ultraviolet rays.

On the film substrate 21, as in the example 1, an NMP (N-methyl-2-pyrrolidone) solution of polyimide is applied on a substrate by spin-coating and is heated at a temperature of 180° C. to form the first wettability-variable layer 31 having a thickness of 50 nm. Next, ultraviolet rays having a wavelength less than 300 nm from an extra high pressure mercury lamp are irradiated onto the first wettability-variable layer 31 through a photo-mask with an exposure dose of 8 J/cm² to form the high surface free energy regions on the first wettability-variable layer 31.

Next, by means of inkjet, nano-silver ink is ejected onto the high surface free energy regions, and the resulting structure is heated at a temperature of 180° C. to form the gate electrode 22 having film thickness of 50 nm. On the gate electrode 22, a polyimide solution PI213 (manufactured by Maruzen Petrochemical CO. LTD.) is applied by spin-coating and is heated at a temperature of 180° C. to form the gate insulating film 23 having a thickness of 500 nm. Next, similarly, on the gate insulating film 23, the second wettability-variable layer 24 having a thickness of 100 nm is formed from polyimide as in the example 4.

Next, ultraviolet rays of a wavelength less than 300 nm (from an extra high pressure mercury lamp) are irradiated with a dose of 8 J/cm² (in the example 5) or 40 J/cm² (in the comparative example 2) through a photo-mask having line-shaped patterns at intervals of 5 μm to form the high surface free energy regions on the second wettability-variable layer 24.

Next, by means of inkjet, nano-silver ink is ejected onto the high surface free energy regions, and the resulting structure is heated at a temperature of 180° C. to form the source-drain electrode 25 having a thickness of 50 nm.

Next, in the same way as in the example 4, the organic semiconductor layer 26 is formed, and an organic transistor is fabricated. In these organic transistors, the insulating layer 23 and the second wettability-variable layer 24 function as a gate insulating film.

In the example 5, patterning performance of the gate electrodes and the source-drain electrode 25 is good. Through evaluation of the transistor characteristics, it is found that in the obtained organic transistor, the on-off ratio Ion/Ioff, which is a ratio of the current in an ON state to the current in an OFF state, is over 10000, and the field effect mobility is $3 \times 10^{-3}$ cm²/V·s.

On the other hand, in the comparative example 1, the gate leakage current (the off current) is large, the on-off ratio Ion/Ioff is about 1, and the field effect mobility is of the order of $10^{-5}$ cm²/V·s. It is predicted that this is because the average height difference between the high surface free energy regions (regions exposed by ultraviolet rays) and the low surface free energy regions (regions not exposed by ultraviolet rays) exceeds 10% of the film thickness of the second wettability-variable layer 24, which also serves as the gate insulating film, and the leakage current becomes large.

EXAMPLE 6

Figure 8A:
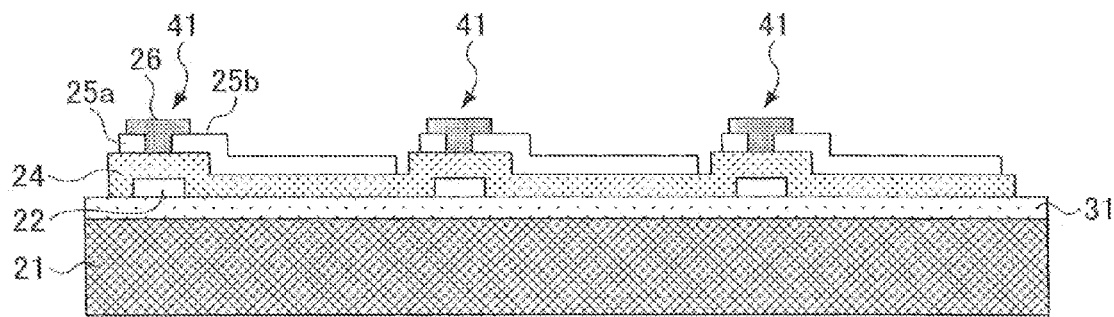
FIG. 8A and FIG. 8B are a cross-sectional view and a plan view of an electronic device array according to an example 6 of the first embodiment.
Figure 8B:
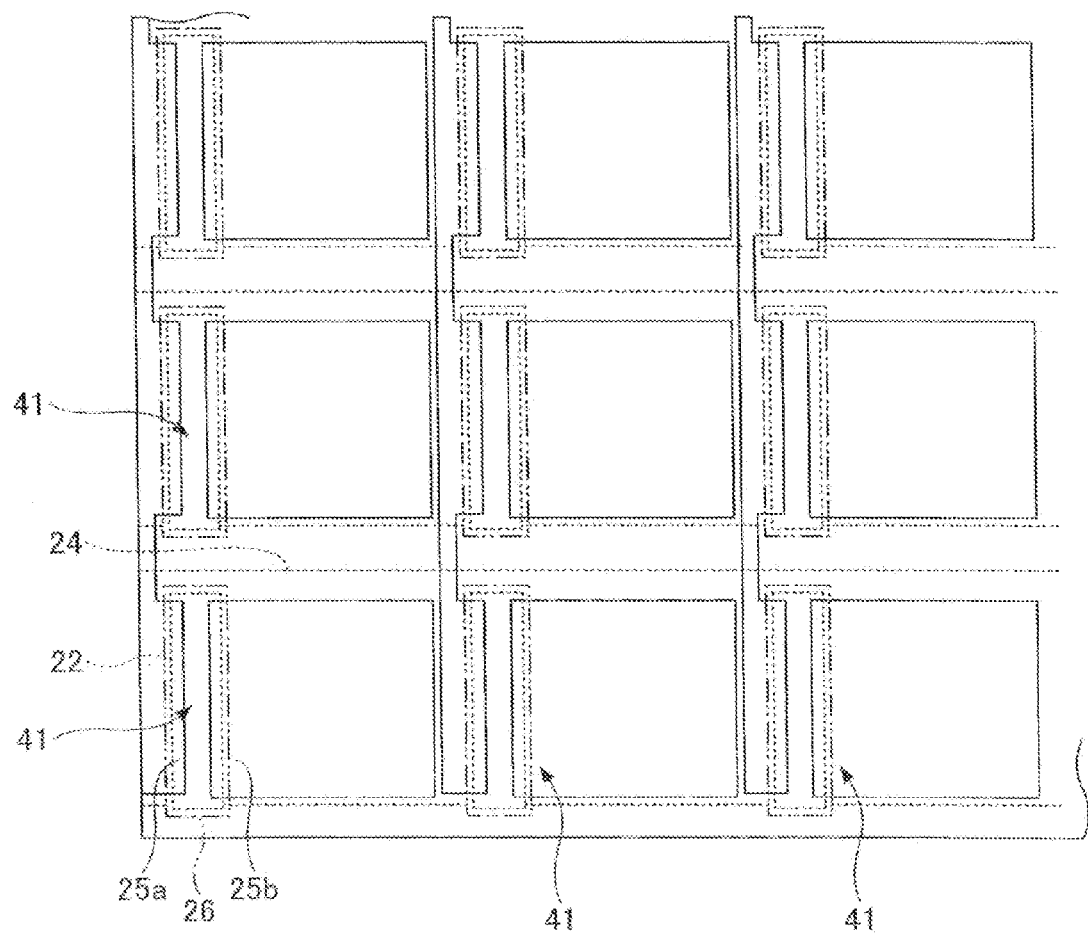

FIG. 8A and FIG. 8B are a cross-sectional view and a plan view of an electronic device array according to an example 6 of the present embodiment.

In FIG. 8A and FIG. 8B, the same reference numbers are assigned to the same elements as those illustrated in FIG. 6 and FIG. 7, and overlapping descriptions are omitted.

In FIG. 8A and FIG. 8B, there are electronic devices 41, for example, organic transistors, and a source electrode 25a and a drain electrode 25b.

In the example 6, an electronic device array includes plural electronic devices 41 (organic transistors) each having the same structure as the organic transistor in the example 4. Specifically, 200×200 organic transistors 41 having element-pitches of 127 μm are arranged on the substrate 21 in a two-dimensional array manner. Each of the organic transistors 41 is formed in the same way as that in the example 4.

Through evaluation of the transistor characteristics, it is found that the average field effect mobility of the organic transistors 41 is $1.3 \times 10^{-3}$ cm²/V·s.

Therefore, by arranging plural electronic devices each using the laminate structure of the present embodiment on a substrate, it is possible to simplify the fabrication process, and obtain an electronic device array of low cost and formed from thin film transistors each having high performance.

EXAMPLE 7

Figure 9:
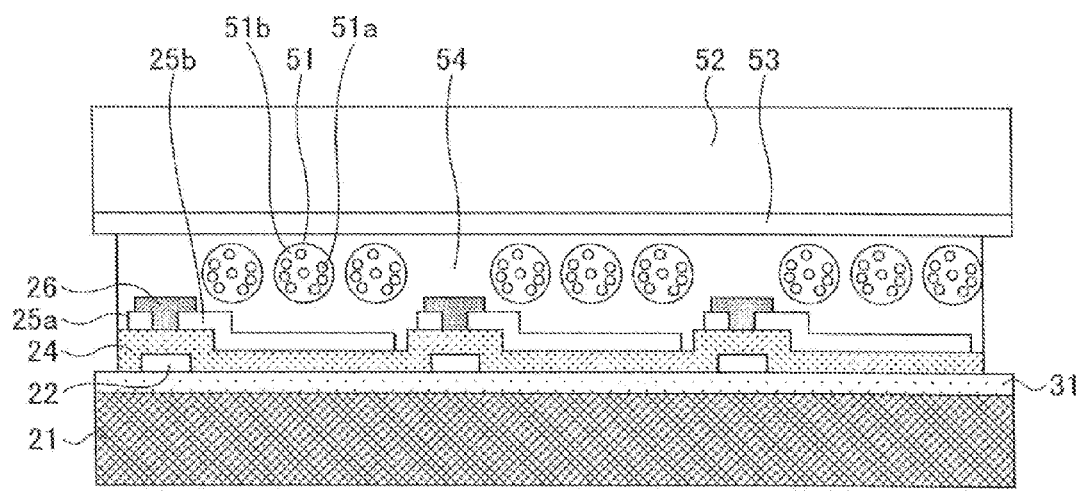
FIG. 9 is a cross-sectional view of a display device according to an example 7 of the first embodiment, which uses the electronic device array as shown in FIG. 8A and FIG. 8B in the example 6.

FIG. 9 is a cross-sectional view of a display device according to an example 7 of the present embodiment, which uses the electronic device array as shown in FIG. 8A and FIG. 8B in the example 6.

In FIG. 9, the same reference numbers are assigned to the same elements as those illustrated in FIG. 6, FIG. 7, and FIG. 8A and FIG. 8B, and overlapping descriptions are omitted.

The display device shown in FIG. 9 includes a polyethylene naphthalate substrate 52 serving as an opposite substrate, microcapsules 51 serving as display elements, titanium oxide particles 51a, oil-blue-colored isopar 51b, an ITO transparent electrode 53, and a PVA (polyvinyl alcohol) binder 54.

In the example 7, a display device using the electronic device array as shown in FIG. 8A and FIG. 8B is fabricated. Specifically, an application liquid obtained by mixing the microcapsules 51, which include the titanium oxide particles 51a and the oil-blue-colored isopar 51b, and a water solution of polyvinyl alcohol (PVA) is applied on the ITO transparent electrode 53 arranged on the polyethylene naphthalate substrate 52, thereby forming a layer including the microcapsules 51 and the PVA binder 54. The thus obtained substrate and the electronic device array as shown in FIG. 8A and FIG. 8B are combined together so that the substrate 21 and the ITO transparent electrode 53 are on the outer side. A driver IC for use of scan signals is connected to a bus line in connection with the gate electrode 22, and a driver IC for use of data signals is connected to a bus line in connection with the source electrode 25a.

When switching displayed images each 0.5 seconds, it is found that still images are displayed properly.

Therefore, by using the electronic device array including the laminate structure of the present embodiment, it is possible to obtain a display device of low cost and superior in flexibility by combining the electronic device array formed from thin film transistors, namely, an active matrix substrate, and a pixel display device.

EXAMPLE 8

An experiment was performed to study an appropriate value of the groove height in the high surface free energy regions along the boundary between the low surface free energy regions and the high surface free energy regions.

In this example, an NMP (N-methyl-2-pyrrolidone) solution of polyimide, which has a hydrophobic group on a side chain and the surface free energy of which changes due to energy application by ultraviolet rays irradiation, is applied on a glass substrate by spin-coating. After the substrate is pre-heated in an oven at a temperature of 100° C., the solvent is removed at a temperature of 180° C. to form the wettability-variable layer. Then, ultraviolet rays having a wavelength less than 300 nm from an extra high pressure mercury lamp are irradiated onto the wettability-variable layer through a photomask having a pattern, and thereby, forming exposed regions and un-exposed regions on the same surface of the wettability-variable layer.

Referring to FIG. 2, the boundary between the region exposed to ultraviolet rays (the high surface free energy region) and the regions not exposed by ultraviolet rays (the low surface free energy region) is depressed, thereby forming a groove. The NMP (N-methyl-2-pyrrolidone) solution of the polyimide as described in the present embodiment is applied on the aluminum film by spin coating. After the substrate is pre-heated in an oven at a temperature of 100° C., the solvent is removed at a temperature of 180° C. to form the wettability-variable layer having a thickness of 400 nm.

Next, ultraviolet rays of a wavelength less than 300 nm from an extra high pressure mercury lamp are irradiated onto the wettability-variable layer at various doses. Thereby, regions of various exposure doses and un-exposed regions are formed on the same surface of the wettability-variable layer. Next, an aluminum electrode is fabricated on the exposed areas as well as the un-exposed areas of the substrate by vacuum evaporation through a mask pattern having a hole of diameter 1 mm. Then, a voltage is applied to this structure with the aluminum electrode throughout the glass substrate as a lower electrode, and the aluminum electrode having a diameter of 1 mm as an upper electrode to measure leakage current of the wettability-variable layer (namely, current flowing through the thickness direction of the wettability-variable layer). In addition, nano-silver ink droplets are ejected by inkjet in the regions exposed by ultraviolet rays, and measurements are made of stopping conditions of ink droplets on the boundaries between the high surface free energy regions (regions exposed by ultraviolet rays) and the low surface free energy regions (regions not exposed by ultraviolet rays).

The measurement results are shown in Table 4.

Table 4 shows measurement results of the leakage current of the wettability-variable layer and stopping conditions of ink droplets on the boundaries.

As shown in Table 4, the average depth of the groove along the boundaries between the low surface free energy regions and the high surface free energy regions increases along with the exposure dose of the ultraviolet rays.

In addition, as shown in Table 4, when there is no groove, ink may spread to the end of the exposure pattern, but when the grooves are formed, the ink stops at the end of the exposure pattern; therefore, good ink patterns can be formed.

When the ratio of the average depth of the grooves along the boundaries between the low surface free energy regions and the high surface free energy regions over the thickness of the wettability-variable layer (400 nm) is less than or equal to 1%, the leakage current is essentially the same as that when ultraviolet rays are not irradiated.

TABLE 4

| UV Dose [J/cm$^2$] | Nano Silver Ink Contact Angle [°] | Average Groove Depth [nm] | Leakage Current | Ratio Of Average Groove Depth To 400 nm Film Thickness [%] | Ink Droplet Stopping Condition |
|---|---|---|---|---|---|
| 0 | 30 | 0 | ⊚ | 0 | X |
| 1 | 21 | 0 | ⊚ | 0 | X |
| 3 | 5 | 0 | ⊚ | 0 | Δ |
| 5 | 5 | 3 | ⊚ | 0.8 | ○ |
| 10 | 5 | 9 | ⊚ | 2.3 | ○ |
| 50 | 5 | 18 | ○ | 4.5 | ○ |
| 100 | 5 | 34 | Δ | 8.5 | ○ |
| 200 | 5 | 44 | X | 11 | ○ |

⊚: Very Good, ○: Good, Δ: Not bad, X: Bad

However, when the ratio of the average depth of the grooves exceeds 4.5%, the leakage current increases gradually, and when the ratio of the average depth of the grooves reaches 8.5%, the leakage current is very large in all samples under measurements.

Therefore, from the measurement results shown in Table 4, it is found that the ratio of the average depth of the grooves over the thickness of the wettability-variable layer of about 10% is an upper limit for the leakage current to be tolerable.

EXAMPLE 9

Another experiment was performed to study an appropriate range of the value of the height difference (the step) between the low surface free energy regions and the high surface free energy regions.

In this example, the laminate structure is fabricated in the same way as that in the example 1.

Table 5 shows measurement results of stopping conditions of ink droplets on the boundary.

As shown in Table 5, because a groove is formed in the high surface free energy region along the boundary between the low surface free energy region and the high surface free energy region, the overall stopping conditions of ink droplets are good. However, when the average height difference is 5 nm or more the liquid droplets completely stay in the boundary region because of a combination of the effect of the groove and the effect of the step (height difference).

Therefore, from the measurement results shown in Table 5, an average height difference of 5 nm is a limit for confining the liquid droplets after landing. That is, when the average height difference between the high surface free energy region and the low surface free energy region is equal to or greater than 5 nm, the liquid droplets can be completely confined in the high surface free energy region after landing.

TABLE 5

| UV Dose [J/cm$^2$] | Nano Silver Ink Contact Angle [°] | Average Groove Depth [nm] | Average Height Difference [nm] | Ink Droplet Stopping Condition |
|---|---|---|---|---|
| 0 | 32 | 0 | 0 | X |
| 1 | 18 | 0 | 0 | Δ |
| 3 | 5 | 3 | 2 | ○ |
| 5 | 5 | 7 | 5 | ◎ |
| 10 | 5 | 12 | 8 | ◎ |
| 20 | 5 | 15 | 11 | ◎ |

◎: Very Good, ○: Good, Δ: Not bad, X: Bad

Second Embodiment

Figure 10:
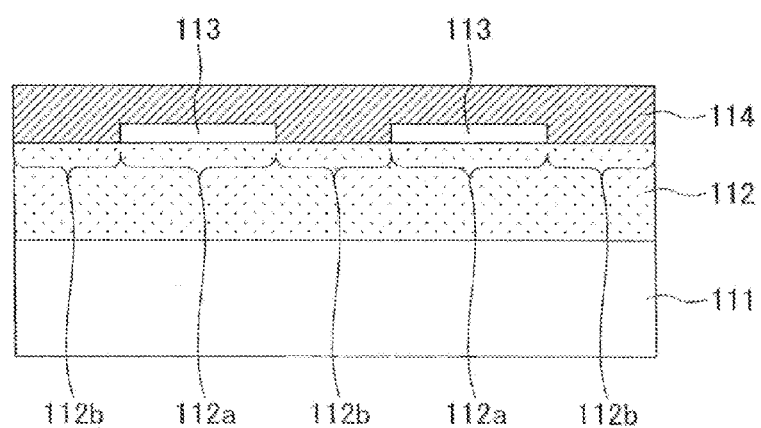
FIG. 10 is a cross-sectional view of a laminate structure according to a second embodiment of the present invention.

FIG. 10 is a cross-sectional view of a laminate structure according to a second embodiment of the present invention.

As shown in FIG. 10, a laminate structure of the present embodiment includes a substrate 111, a wettability-variable layer 112, conductive layers 113, and an insulating layer 114. The wettability-variable layer 112 includes high surface free energy regions 112a and low surface free energy regions 112b. The high surface free energy regions 112a and the low surface free energy regions 112b correspond to the second surface free energy region and the first surface free energy region in claims of the present application, respectively.

In the laminate structure shown in FIG. 10, the substrate 111 may be a glass substrate, a film substrate, or others which can be used to form wirings, electronic devices, an electronic device array, or a display device. For example, the film substrate may be a polyimide (PI) substrate, a polyethersulfone (PES) substrate, a polyethylene terephthalate (PET) substrate, or a polyethylene naphthalate (PEN) substrate.

In the laminate structure shown in FIG. 10, the wettability-variable layer 112 is formed on the substrate 111, the conductive layers 113 are formed on the wettability-variable layer 112, and the insulating layer 114 is formed on the conductive layers 113.

Here, the wettability-variable layer 112 is formed of materials having critical surface tension that changes when energy is applied thereon by heating, or by using ultraviolet rays, electron beams, plasma, or others; the wettability-variable layer 112 includes at least two regions having different critical surface tension. The critical surface tension is also referred to as "surface free energy". In FIG. 10, the high surface free energy regions 112a have relatively high critical surface tension (surface free energy), and the low surface free energy regions 112b have relatively low critical surface tension (surface free energy).

Although it is necessary to impose energy on the wettability-variable layer 112 by heating, or by using ultraviolet rays, electron beams, plasma, or others to form the high surface free energy regions 112a, from the point of view of fabricating miniaturized patterns, it is preferable that energy application be performed by using ultraviolet rays or an electron beam. Nevertheless, when the material of the wettability-variable layer 112 is organic, it is preferable to use ultraviolet rays since the electron beam may damage the organic material and degrade the insulating property of the organic material. Further, when using the electron beam, through-put is low and a vacuum apparatus is required. In contrast, when using the ultraviolet rays, damage to the organic material is low, exposure can be performed at one time in the air, and through-put is high; hence, it is possible to design a fabricating process as desired. Intervals between two adjacent high surface free energy regions 112a correspond to interconnections or semiconductor channels, which separate electrodes. When using the ultraviolet rays, the intervals can be formed small, for example, in a range from 1 μm to 5 μm.

On the surface areas of the wettability-variable layer 112 where the conductive layers 113 are to be disposed, as described below, by irradiating ultraviolet rays on the regions 112a of the wettability-variable layer 112, the portions of the regions 112a to be covered by the conductive layers 113 change to the high surface free energy regions 112a, and fine depressions are formed on the portions of the regions 112a, which have diameters of 1 to 2 μm, and depths of a few nm to a few tens nm. Because fine depressions are formed on the surface areas of the wettability-variable layer 112 where the conductive layers 113 are to be disposed, because of the anchor effect induced by surface roughness, which is well-known in the semiconductor field, adhesiveness of the conductive layers 113 can be improved.

The conductive layers 113 are formed by applying metal particle disperse liquid including metal fine particles on the high surface free energy regions 112a where fine depressions are formed by exposure to ultraviolet rays; as a result, because of the anchor effect, good adhesiveness can be obtained compared to patterning methods relying on the hydrophobic property of the substrate having a bump structure.

Such fine depressions able to improve adhesiveness are formed in a self-aligned manner and only in regions where the ability of preventing separation of the conductive layers 113 is desired. Hence, flatness of the surface of the wettability-variable layer 112 between two adjacent conductive layers 113 is not affected. When the portion of the wettability-variable layer 112 between two adjacent conductive layers 113 acts as an organic semiconductor channel, since the portion of the wettability-variable layer 112 between two adjacent conductive layers 113 has low surface free energy, little physisorbed water, few polar groups, and good surface flatness, there is little degradation of transistor characteristics, and a preferable device structure is obtainable.

Usually, surface treatment expected to induce the anchor effect is carried out by oxygen or nitrogen plasma processing or argon sputtering. However, in these processing, the whole surface of the substrate is processed. Due to this, when the portion where the organic semiconductor channel is to be formed is subject to the same surface treatment, surface flatness of the portion may be degraded, and thus transistor characteristics may deteriorate. Partial surface modification is possible by means of masking with a resist mask or a metal mask; however, this method involves a large number of processing steps, and surface characteristics may be altered in processing after the resist mask is removed, and further, the patterning precision is low.

In the present embodiment, these problems are avoided, and the fine depressions are formed in a self-aligned manner and only in regions where the ability to prevent film separation is desired.

In addition, depressions on the portion of the surface of the wettability-variable layer 112 in close contact with the conductive layers 113 are formed to have appropriate surface roughness so as to improve adhesiveness. Such surface roughness does not induce degradation of voltage resistance in the vertical direction; thus it can be used in improving adhesiveness to stacked wiring, gate electrodes or source/drain electrodes of electronic devices.

In the laminate structure shown in FIG. 10, the wettability-variable layer 112 may be a single layer formed of plural kinds of materials, or a single layer formed of a single material.

Alternatively, the wettability-variable layer 112 may include two or more layers. In this case, for example, assuming the wettability-variable layer 112 includes a first layer formed of a first material and a second layer formed of a second material, the first layer and the second layer may be formed to have different functions. For example, from the point of view of improved insulating performance, the wettability-variable layer 112 can be formed such that the electrical insulating property of the first material is better than the electrical insulating property of the second material, and the increase rate of the surface free energy of the second material caused by application of energy like ultraviolet rays is greater than the increase rate of the surface free energy of the first material.

Alternatively, the wettability-variable layer 112 may be a single layer formed of two or more materials. Assuming the wettability-variable layer 112a is formed from a mix of a first material and a second material, by utilizing differences of material properties of the first material and the second material, the wettability-variable layer 112 may be formed to have a material distribution in a thickness direction of the wettability-variable layer 112. For example, the wettability-variable layer 112 can be formed such that the electrical insulating property of the first material is better than the electrical insulating property of the second material, and the increase rate of the surface free energy of the second material caused by application of energy like ultraviolet rays is greater than the increase rate of the surface free energy of the first material.

The materials constituting the wettability-variable layer 112 may be organic materials or inorganic materials, but organic materials are preferable when using the printing method, which is suitable for fabricating devices at low cost. Further, in order to improve insulating performance, a tiny amount of inorganic materials may be added into the organic materials.

When the wettability-variable layer 112 is formed on an insulating layer, in order to prevent the insulating layer from being affected by irradiation of ultraviolet rays, it is preferable that the wettability-variable layer 112 be formed of materials having absorption coefficients greater than that of the insulating material of the insulating layer.

Organic materials having good insulating properties include polyimide, polyamideimide, epoxy resins, silsesquioxane, poly(vinylphenol), polycarbonate, fluorine-based resins, poly para-xylylene, or poly(vinyl butyral). Here, poly(vinylphenol) and poly(vinylalcohol) may be bridged by appropriate cross-linking agents.

Inorganic materials having good insulating properties include TiO2, SiO2, and others.

It is preferable that polymer materials be used as the materials having a relatively large increase rate of the surface free energy caused by energy application, like ultraviolet rays when using the printing method, which is suitable for fabricating devices at low cost. In addition, it is preferable that the polymer materials have a hydrophobic group on a side chain. Because of the hydrophobic group on the side chain, the surface free energy of the film is low when ultraviolet rays are not irradiated, and the surface free energy of the film becomes high after ultraviolet rays are irradiated to apply energy; hence, it is possible to obtain a large difference between the surface free energy before ultraviolet irradiation and the surface free energy after ultraviolet irradiation, that is, it is possible to increase the contrast between of the hydrophilic surfaces 112a and the hydrophobic surfaces 112b.

In the present embodiment, since the materials having variable critical surface tension (surface free energy) have a rigid structure even after being cut by the ultraviolet rays more or less, it is preferable that polyimide, which has good filling ability, be introduced into a main chain. Due to this, moisture adsorption is not so strong, and the insulating property is good, so that it is possible to obtain a laminate structure having high reliability.

Polyimide includes thermal-setting polyimide, which is generated in a dehydrative condensation reaction by heating a polyamic acid, and soluble polyimide, which is soluble in a solvent.

A soluble polyimide film can be formed as below. First, a polyimide application liquid dissolved in a solvent is applied, then the solvent is volatilized at a relatively low temperature, for example, lower than 200° C., and then the soluble polyimide film is formed.

Concerning the thermal-setting polyimide, since the dehydrative condensation reaction does not occur unless the temperature is increased to be sufficiently high for the dehydrative condensation reaction, usually, it is necessary to heat to 200° C. or higher.

Depending on the specific fabrication process, either the thermal-setting polyimide or the soluble polyimide can be used. Because polyimide is used, despite of a rate of moisture absorption of about 2%, the insulating property is high and stable, thus an insulating property of high reliability is secured, and it is possible to control the wettability.

Below, the polyimide structures according to the present embodiment are described with reference to FIG. 11 and FIG. 12.

Figure 11:
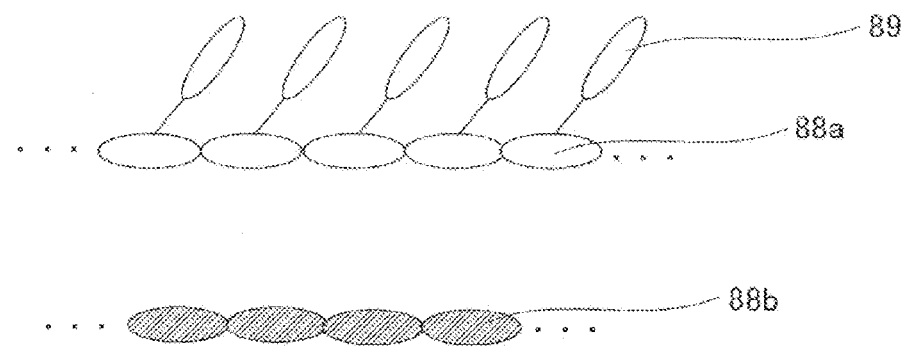
FIG. 11 is a diagram schematically illustrating a polymer material of the second embodiment able to form fine depressions on the surface thereof by energy application.

FIG. 11 is a diagram schematically illustrating a polymer material of the present embodiment able to form fine depressions on the surface thereof by energy application.

Figure 12:
FIG. 12 is a diagram schematically illustrating a polymer material as a comparative example, unable to form the fine depressions on the surface thereof by energy application.

FIG. 12 is a diagram schematically illustrating a polymer material as a comparative example, unable to form the fine depressions on the surface thereof by energy application.

In the present embodiment, the polyimide and the precursor thereof, polyamic acid, are formed of a blend material including two or more kinds of materials. For simplicity, below, it is assumed that the blend material includes two kinds of materials.

As shown in FIG. 11, the polymer material able to form fine depressions on the surface thereof by application of energy such as ultraviolet rays is a blend material of two kinds of polyimide, specifically, the blend material includes a polyimide that has a main chain 88b only but does not have a side chain for controlling the wettability, and a polyimide that has a main chain 88a and a side chain 89 for controlling wettability and resulting in low surface free energy before energy application.

Alternatively, the polymer material able to form fine depressions on the surface thereof by application of energy such as ultraviolet rays is a blend material of two kinds of polyamic acids, specifically, the blend material includes a polyamic acid (a precursor of a polyimide) that has a main chain 88b only but does not have a side chain for controlling the wettability, and a polyamic acid (a precursor of a polyimide) that has a main chain 88a and a side chain 89 for controlling wettability and resulting in low surface free energy before energy application.

In contrast, in the comparative example shown in FIG. 12, the polymer material unable to form fine depressions on the surface thereof by application of energy such as ultraviolet rays is a polyimide or a polyamic acid, which is a precursor of the polyimide, that has a main chain 88 and a side chain 89 for controlling wettability and resulting in low surface free energy before energy application. As shown in FIG. 12, when the polymer material includes only a polyimide or a polyamic acid which has the side chain 89, and when the ratio of the side chain to the main chain is high, a film of good quality cannot be formed, and due to this, it is necessary to reduce the ratio of the side chain to the main chain by copolymerization.

When synthesizing the polyimide or the polyamic acid, when the side chain is introduced at a certain ratio, it is possible to control the surface free energy, and possible to control the wettablility. The specific mechanism of forming fine depressions on the surface by application of energy such as ultraviolet rays in such a blend material has not been clarified, yet. It is thought that phase separation occurs during film formation, for example, the blend material is separated into a polyimide having a side chain and a polyimide not having a side chain, and the polyimide having a side chain is formed in an island shape. When applying energy like ultraviolet rays, the polyimide having a side chain and formed in an island shape is disassociated, and as a result, fine depressions are formed.

In order to induce phase separation, it is necessary to increase the ratio, in units of weight percentage, of the polyimide or the polyamic acid that does not have a side chain to the polyimide or the polyamic acid that has a side chain. In addition, density or depth of the fine depressions can be changed by the exposure dose of the ultraviolet rays.

In FIG. 11 and FIG. 12, as an example in which phase separation occurs easily, it is illustrated that the main chains in FIG. 11 and FIG. 12, respectively, have different structures; however, as long as phase separation occurs, the main chains in FIG. 11 and FIG. 12 may have the same frame.

Table 6 shows measurement results of surface roughness and a cross-cut exfoliation test of a polyimide A of the present embodiment and a polyimide B for comparison.

The polyimide A and the polyimide B are applied by spin-coating, and the whole areas of the polyimide A and the polyimide B are exposed while changing the exposure dose of ultraviolet rays; then the surface roughness of each the polyimide A and the polyimide B is measured. Afterward, a metal particle disperse liquid (nano-metal ink), which is obtained by dispersing Ag particles having a diameter of about 30 nm in an aquatic solvent, is applied to form a film, and then the cross-cut exfoliation test is performed.

In the above measurements, the spin coating is performed at 1500 rpm. After pre-baking in an oven at a temperature of 100° C. in a nitrogen atmosphere, post-baking is performed for one hour in an oven at a temperature of 200° C. in the same nitrogen atmosphere; therefore, the wettability-variable layers each having a thickness of 100 nm are formed on the polyimide A and the polyimide B, respectively.

TABLE 6

| Polyimide | UV Dose [J/cm$^2$] | UV Exposed Surface Ra [nm] | Cross-Cut Non-exfoliation |
|---|---|---|---|
| B | 12 | 0.9 | 22/25 |
| A | 3 | 1.2 | 21/25 |
| A | 5 | 3.4 | 25/25 |
| A | 8 | 6.4 | 25/25 |
| A | 12 | 7.2 | 25/25 |

The forming conditions of nano-metal ink are as below. After pre-baking in an oven at a temperature of 100° C. in an air atmosphere, post-baking is performed in an oven at a temperature of 200° C. in the same air atmosphere for one hour; therefore, a metal film not having any patterns is formed.

As shown in Table 6, when the ultraviolet rays are irradiated on a wettability-variable layer formed of the polyimide A to alter the surface roughness, exfoliation behavior is improved. Note that here, the whole film is exposed for relative comparison of the exfoliation behavior; in the laminate structure of the present embodiment, only the portion where the conductive layers 113 are to be formed is exposed to the ultraviolet rays.

In the present embodiment, from the point of view of the insulating property and reliability, preferably, the wettability-variable layer 112 is made of the blend material including a polyimide that has a main chain only but does not have a side chain for controlling the wettability, and a polyimide that has a main chain and a side chain for controlling wettablility and resulting in low surface free energy before energy application. Alternatively, the wettability-variable layer 112 is made of the blend material including a polyamic acid (a precursor of the polyimide) that has a main chain only but does not have a side chain for controlling the wettability, and a polyamic acid (a precursor of the polyimide) that has a main chain and a side chain for controlling wettablility and resulting in low surface free energy before energy application.

However, from the point of view of preventing film exfoliation, as long as the above-mentioned island-shape phase separation occurs, and as long as the blend material includes a material that has a main chain only but does not have a side chain for controlling the wettability and a material that has a main chain and a side chain for controlling wettablility and resulting in low surface free energy before energy application, the wettability-variable layer, which constitutes the laminate structure and provides the wettability control function, can also be formed from epoxy resins, fluorine resin, acrylic resin, poly(vinylphenol), or polyvinyl butyral); with these materials, the same fine suppressions can be formed by application of energy like ultraviolet rays.

In the present embodiment, preferably, the thickness of the wettability-variable layer 112 is from 30 nm to 3 μm, more preferably, from 50 nm to 1 μm. When the wettability-variable layer 112 is too thin, for example, less than 30 nm, bulk properties of the wettability-variable layer 112 may be degraded, such as insulating performance, gas-barrier ability, and humidity-resistance. On the other hand, when the thickness of the wettability-variable layer 112 is greater than 3 μm, the surface shape of the wettability-variable layer 112 may be degraded.

The metal particle disperse liquid may include silver (Ag), gold (Au), copper (Cu), platinum (Pt), palladium (Pd), tungsten (W), nickel (Ni), tantalum (Ta), Bismuth (Bi), lead (Pb), Indium (In), tin (Sn), Zinc (Zn), titanium (Ti), or aluminum (Al), or alloys of the above materials, or fine particles of silver halogen. Silver (Ag) and copper (Cu) are preferable because they have low electrical resistance.

In order to disperse materials, surfaces of conductive materials constituting these fine particles may be coated with organic materials or conductive materials. It is preferable that the coating materials be conductive, but even when the coating materials are insulating materials, the coating materials can be removed by heating.

In addition, when fine particles are formed from alloys of silver (Ag) and one or more metals selected from gold (Au), platinum (Pt), palladium (Pd), ruthenium (Ru), iridium (Ir), tin (Sn), copper (Cu), nickel (Ni), iron (Fe), cobalt (Co), titanium (Ti), and indium (In), and atomic concentration of Ag in the alloys is 80 to 99.9%, and the average crystal diameter is 0.2 to 5 μm it is possible to further improve adhesiveness in the laminate structure of the present embodiment.

The liquid including conductive materials can be applied on the surface of the wettability-variable layer 112 by spin-coating, dip coating, screen printing, offset printing, or inkjet printing. In order to be easily affected by the surface free energy of the wettability-variable layer 112, it is preferable to use inkjet because inkjet supplies much small liquid droplets. In addition, material utilization efficiency of inkjet is much higher than that of spin-coating, and this enables a low cost process.

Note that in FIG. 10, although it is illustrated that the insulating layer 114 is formed on the conductive layers 113, in an electronic device or an electronic device array, and a display device using the electronic device and the electronic device array, the insulating layer 114 can be replaced with a semiconductor layer.

Irradiation of ultraviolet rays can be carried out with devices illustrated in FIG. 5A and FIG. 5B in the first embodiment. Overlapping descriptions are omitted.

Below, specific examples of the present embodiment are explained with reference to accompanying drawings.

EXAMPLE 1

FIG. 13A through FIG. 13D are cross-sectional views schematically illustrating formation of a laminate structure according to the present embodiment.

First, an NMP (N-methyl-2-pyrrolidone) solution of a thermal-setting polyimide (polyimide A) having a hydrophobic group on a side chain, is applied by spin-coating on a glass substrate 131 cleaned by wet-cleaning. The thermal-setting polyimide is a blend material including a polyamic acid that has a main chain only but does not have a side chain for controlling the wettability, and a polyamic acid that has a main chain and a side chain for controlling wettablility and resulting in low surface free energy before energy application.

The thermal-setting polyimide is a polyimide material imidized by copolymerization of a polyamic acid that has a main chain only but does not have a side chain for controlling the wettability, and a polyamic acid that has a main chain and a side chain for controlling wettablility and resulting in low surface free energy before energy application.

In the present example, the spin coating is performed at 1500 rpm, and after pre-baking in an oven at a temperature of 100° C. in a nitrogen atmosphere, post-baking is performed for one hour in an oven at a temperature of 200° C. in the same nitrogen atmosphere; therefore, an imidized polyimide film is formed, obtaining a wettability-variable layer 132 having a thickness of about 100 nm.

Figure 13A:
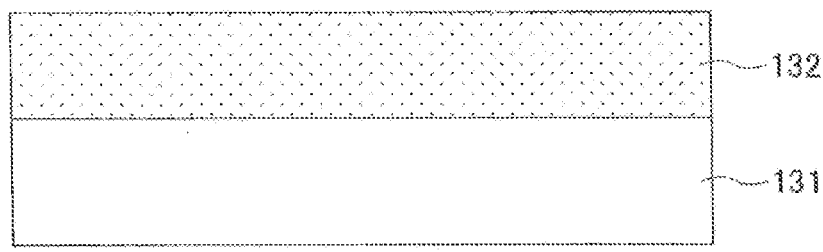
FIG. 13A through FIG. 13D are cross-sectional views schematically illustrating formation of a laminate structure according to the second embodiment.

FIG. 13A is a cross-sectional view schematically illustrating formation of the wettability-variable layer 132 on the glass substrate 131.

In the structure shown in FIG. 13A, the surface of the wettability-variable layer 132 has low surface free energy because of the polyimide having a hydrophobic side chain. The wettability-variable layer 132 is in contact with a conductive layer 133, and constitutes an insulating underlying layer disposed below the conductive layer 133.

Next, ultraviolet rays having a wavelength less than 300 nm from an extra high pressure mercury lamp are irradiated onto the wettability-variable layer 132 through a photo-mask 135 having openings corresponding to an interconnection pattern, and thereby forming regions exposed by the ultraviolet rays and regions not exposed by the ultraviolet rays on the same surface of the wettability-variable layer 132.

Figure 13B:
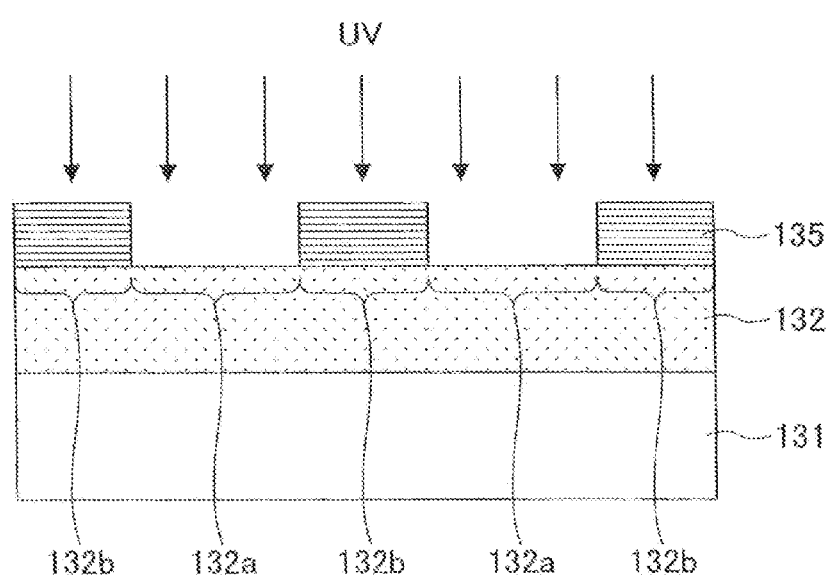

FIG. 13B is a cross-sectional view schematically illustrating exposure of ultraviolet rays onto the wettability-variable layer 132 through the photo-mask 135.

The regions exposed by the ultraviolet rays constitute high surface free energy regions 132a, and the regions not exposed by the ultraviolet rays constitute low surface free energy regions 132b induced by the polyimide having a hydrophobic side chain.

In this example, the exposure dose of the ultraviolet rays is 8 J/cm$^2$.

Next, the surface of the wettability-variable layer 132 exposed by the ultraviolet rays is observed by using an Olympus nano-search microscope LEXT OLS3500.

Figure 14:
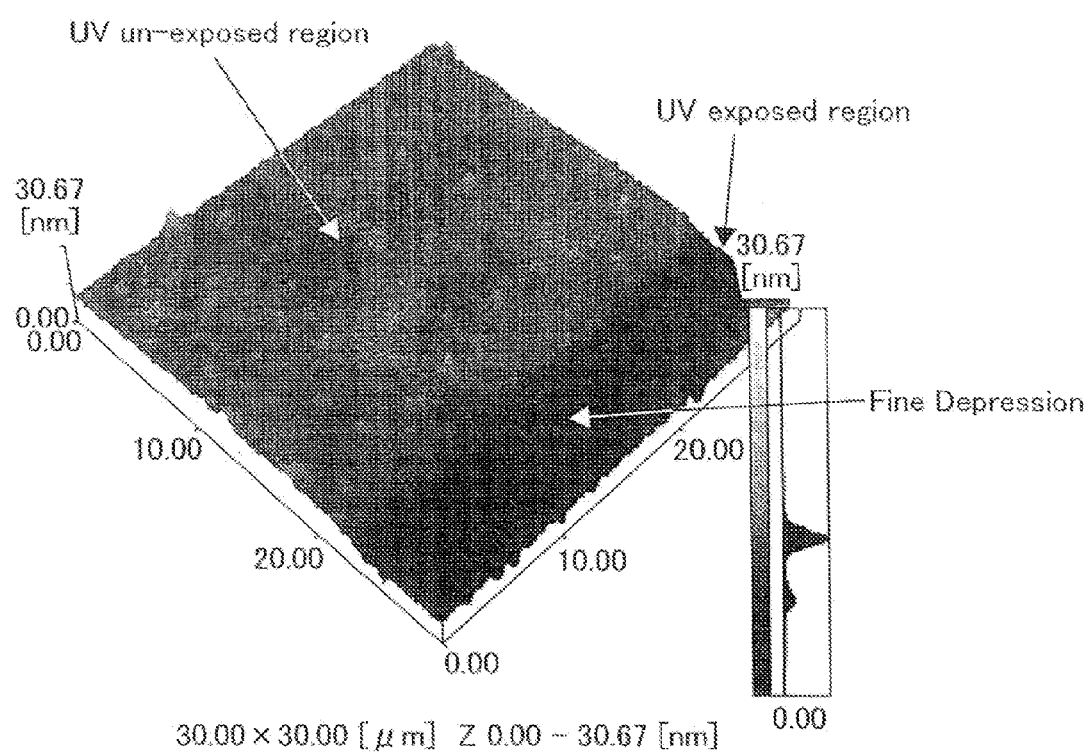
FIG. 14 shows an atomic force microscope photograph of the surface of the wettability-variable layer in the present example which is formed from polyimide A.

FIG. 14 shows an atomic force microscope photograph of the surface of the wettability-variable layer in the present example which is formed from polyimide A.

As shown in FIG. 14, on the high surface free energy regions 132a, which are exposed by the ultraviolet rays, a large number of depressions are formed, each of which has a diameter of 1 to 2 μm, and a depth of a few nm to over ten nm. The density and depth of the fine depressions can be changed by the exposure dose of the ultraviolet rays. In the present example, an arithmetic average surface roughness Ra of the high surface free energy regions 132a exposed to the ultraviolet rays is about 6.4 nm. It is thought that adhesiveness is improved because of the large number of fine depressions.

Note that here, photolithographic equipment used in liquid crystal display or PDP manufacturing can be used to perform photolithographic contact printing, or proximity lithography. In the photolithographic contact printing, the pattern resolution is high; however, since the film surface is in close contact, after a certain number of fabrication cycles, it is necessary to clean the photo mask. On the other hand, in the proximity lithography, since a gap is formed between the photo mask and the wettability-variable layer 132, although the pattern resolution is relatively low more or less, contamination of the photo mask, as in the photolithographic contact printing, does not occur. Thus, the proximity lithography is preferable. Here, for example, the photo mask has an interconnection width of 80 μm, and a space between interconnections of 40 μm.

Next, a metal particle disperse liquid (nano-metal ink), which is obtained by dispersing Ag particles having a diameter of about 30 nm in an aquatic solvent, is selectively ejected, by inkjet, onto the high surface free energy regions 132a.

When using inkjet, it is possible to selectively apply the metal particles formed of the relatively expensive Ag particles on areas of the high surface free energy regions 132a where the conductive layers 133 are to be formed; compared to spin-coating and etching, the material utilization is high, and it is possible to simplify the fabrication process and reduce the cost of fabrication of the laminate structure. That is, inkjet is suitable for fabrication of the laminate structure at low cost.

In addition, since an aquatic metal particle disperse liquid is used, the metal particle disperse liquid droplets spread throughout the high surface free energy regions 132a; hence, it is possible to form fine patterns regardless of the size of inkjet droplets.

In addition, since the conductive layer 133 are not formed on hydrophobic areas, the adhesiveness between the wettability-variable layer 132, which constitutes an underlying layer, and the conductive layer 133 is relatively good; further, since many fine depressions are selectively formed in areas of the high surface free energy regions 132a where the conductive layers 133 are to be formed, the adhesiveness is further improved.

Next, pre-baking is performed in an oven at a temperature of 100° C. in the air atmosphere, and post-baking is performed in the oven at a temperature of 200° C. in the same air atmosphere for one hour; therefore the conductive layer 133 is formed which has an interconnection width of 80 µm, a space between the interconnections of 40 µm, and a thickness of 150 nm.

Figure 13C:
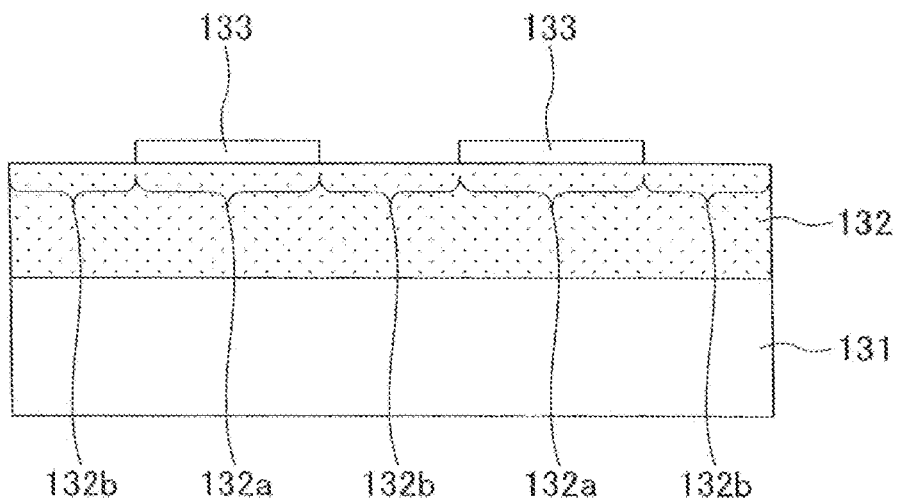

FIG. 13C is a cross-sectional view schematically illustrating formation of the conductive layers 133 on the high surface free energy regions 132a of the wettability-variable layer 132.

As shown in FIG. 13C, the surface of the conductive layer 133 is flat and smooth, that is, formation of the surface of the conductive layer 133 is not influenced by the many fine depressions formed on the wettability-variable layer 132, which is the underlying layer. Measurement results of a tape test reveal that exfoliation of the conductive layer 133 was not observed.

Next, in order to sustain the insulating property of the conductive layers 133, an epoxy resin insulating layer 134 is formed on the conductive layers 133 by spin-coating.

Figure 13D:
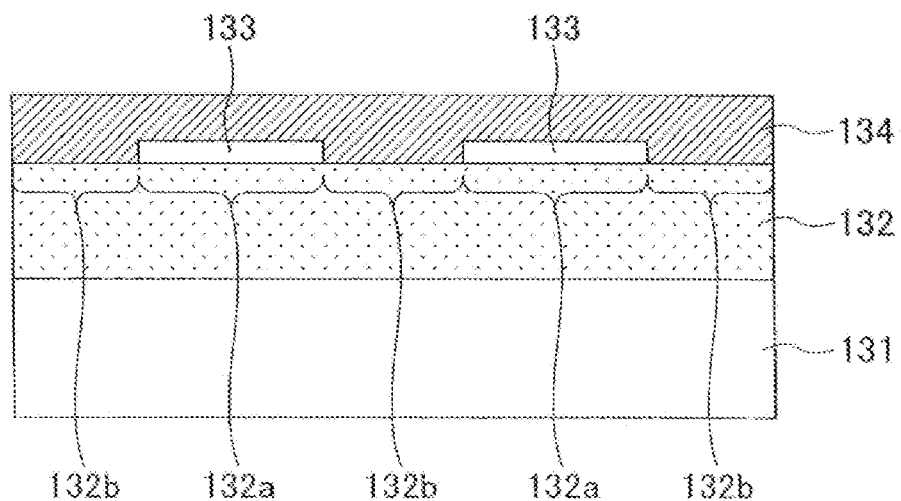

FIG. 13D is a cross-sectional view schematically illustrating formation of the insulating layer 134 on the conductive layers 133.

According to this example, the wettability-variable layer 132, the conductive layer 133, and the insulating layer 134 can be formed by printing, such as spin-coating and inkjet, so that it is possible to fabricate a laminate structure of low cost.

In addition, by exposure to the ultraviolet rays, since a large number of depressions are formed on portions of the high surface free energy regions (the second surface free energy regions) 132a of the underlying wettability-variable layer 132, which is exposed to the ultraviolet rays, and on which the conductive layers 133 are to be disposed, it is possible to fabricate a laminate structure at low cost through simple fabrication processes, which has high adhesiveness between the conductive layers 133 formed from metal particle disperse liquid including metal particles, and the high surface free energy regions (the second surface free energy regions) 132a of the underlying wettability-variable layer 132 disposed below the conductive layers 133.

In addition, since the underlying layer is the underlying wettability-variable layer 132 which has the high surface free energy regions (the second surface free energy regions) 132a converted from the low surface free energy regions (the first surface free energy regions) 132b by energy application, and the conductive layers 133 are formed on the high surface free energy regions 132a of the wettability-variable layer 132, the adhesiveness between the conductive layers 133 and the high surface free energy regions 132a of the underlying wettability-variable layer 132 is improved, and it is possible to form fine patterns.

In addition, since the wettability-variable layer 112 is made of a blend material including a polyimide that has a main chain only but does not have a side chain for controlling the wettability, and a polyimide that has a main chain and a side chain for controlling wettablility and resulting in low surface free energy before energy application, or alternatively, the wettability-variable layer 112 is made of a blend material including a polyamic acid (a precursor of the polyimide) that has a main chain only but does not have a side chain for controlling the wettability, and a polyamic acid (a precursor of the polyimide) that has a main chain and a side chain for controlling wettablility and resulting in low surface free energy before energy application, by controlling the wettability, it is possible to obtain a laminate structure having a high insulating property and reliability.

Further, a method of fabricating a laminate structure of the present embodiment includes a step of forming the high surface free energy regions 132a and the low surface free energy regions 132b by changing the critical surface tension (surface free energy) of the wettability-variable layer 132, and a step of forming the conductive layers 133 on the high surface free energy regions 132a of the wettability-variable layer 132 by applying the metal particle disperse liquid including metal particles on the high surface free energy regions 132a. A large number of fine depressions are selectively formed on the high surface free energy regions 132a of the wettability-variable layer 132 where the conductive layers 133 are to be formed, the adhesiveness between the conductive layers 133 formed of metal particle disperse liquid including metal particles and the high surface free energy regions 132a of the underlying wettability-variable layer 132 disposed below the conductive layers 133 is further improved, and it is possible to fabricate a laminate structure having fine patterns.

Since the fine depressions are formed on the high surface free energy regions 132a of the wettability-variable layer 132 where the conductive layer 133 are to be formed by exposure to ultraviolet rays, it is possible to fabricate a laminate structure at low cost and high throughput, in which the adhesiveness between the conductive layers 133 formed of the metal particle disperse liquid including metal particles and the high surface free energy regions 132a of the underlying wettability-variable layer 132 disposed below the conductive layers 133 is further improved, and fine patterns can be formed.

Since the metal particle disperse liquid including metal particles is applied by inkjet, it is possible to fabricate a laminate structure with high material utilization through, a fabrication process of low cost, in which the adhesiveness between the conductive layers 133 formed of the metal particle disperse liquid including metal particles and the high surface free energy regions 132a of the underlying wettability-variable layer 132 disposed below the conductive layers 133 is further improved, and fine patterns can be formed.

Since the fine depressions are formed by exposure to ultraviolet rays, it is possible to fabricate a laminate structure having high reliability and low cost.

COMPARATIVE EXAMPLE 1

Figure 15:
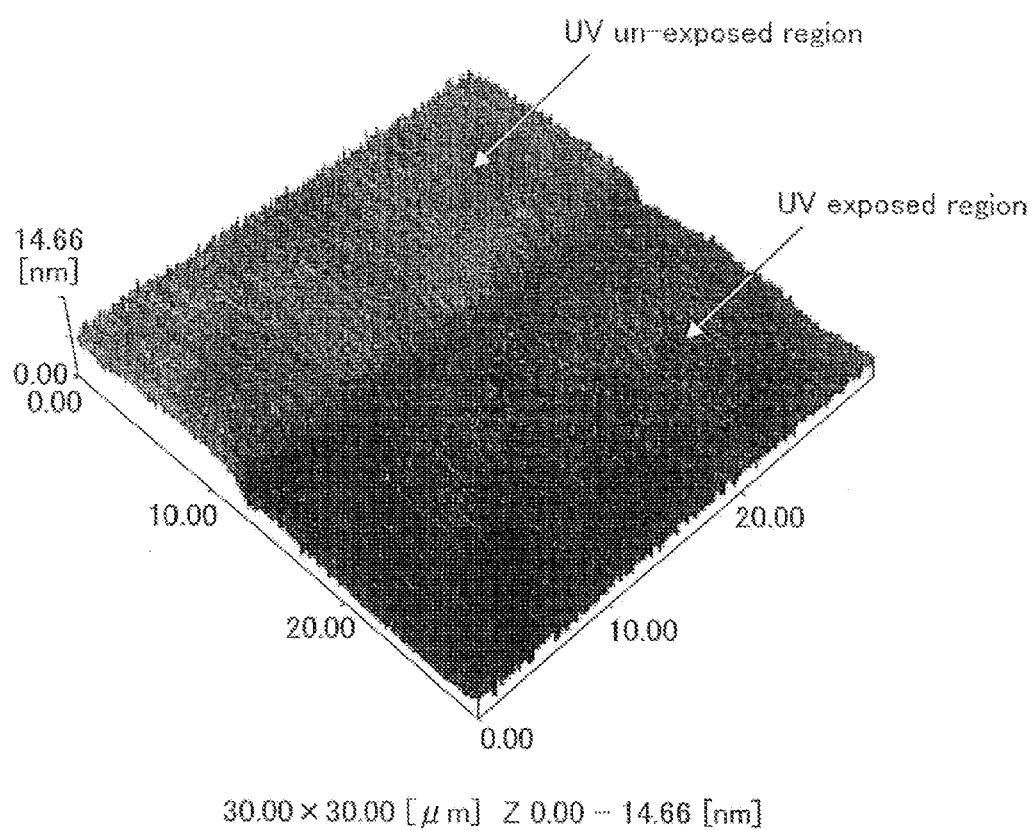
FIG. 15 shows an atomic force microscope photograph of the surface of the wettability-variable layer in the present example which is formed from polyimide B.

FIG. 15 shows an atomic force microscope photograph of the surface of the wettability-variable layer in the present example which is formed from polyimide B.

In the present example, the soluble polyimide (polyimide B) is a polyimide material imidized by copolymerization of a polyamic acid that has a main chain only but does not have a side chain for controlling the wettability, and a polyamic acid that has a main chain and a side chain for controlling wettablility and resulting in low surface free energy before energy application.

First, an NMP (N-methyl-2-pyrrolidone) solution of a polyimide (polyimide B) having a side chain of a different structure, is applied by spin-coating on a glass substrate 131 cleaned by wet-cleaning, as in the example 1.

In the present example, the spin coating is performed at 1500 rpm, and after pre-baking in an oven at a temperature of 100° C. in a nitrogen atmosphere, post-baking is performed for one hour in an oven at a temperature of 200° C. in the same nitrogen atmosphere; therefore, the solvent of the soluble polyimide material is removed, and a polyimide film is formed, obtaining a wettability-variable layer 132 having a thickness of about 100 nm.

Next, ultraviolet rays having a wavelength less than 300 nm from an extra high pressure mercury lamp are irradiated onto the wettability-variable layer 132 through a photo-mask 135 having openings corresponding to an interconnection pattern, and thereby, forming regions exposed by the ultraviolet rays and regions not exposed by the ultraviolet rays on the same surface of the wettability-variable layer 132. In this example, the exposure dose of the ultraviolet rays is 12 J/cm².

In the present example, different from the example 1, an arithmetic average surface roughness Ra of the high surface free energy regions 132a exposed to the ultraviolet rays is 0.9 nm, which is very small, namely, the high surface free energy region 132a is a very smooth film.

Next, the same as the example 1, metal particle disperse liquid (nano-metal ink) obtained by dispersing Ag particles is selectively ejected onto the high surface free energy regions 132a by inkjet.

Next, pre-baking is performed in an oven at a temperature of 100° C. in the air atmosphere, and post-baking is performed in the oven at a temperature of 200° C. in the same air atmosphere for one hour; therefore, the conductive layer 133 is formed which has an interconnection width of 80 μm, a space between the interconnections of 40 μm, and a thickness of 150 nm.

Measurement results of a tape test reveal that exfoliation of part of the conductive layer 133 formed on the wettability-variable layer 132 was observed.

It is predicted that a large number of depressions are not formed on portions of the high surface free energy regions 132a of the underlying wettability-variable layer 132 during exposure to the ultraviolet rays, and sufficient adhesiveness is not secured between the conductive layer 133 formed of metal particle disperse liquid including metal particles, and the high surface free energy regions 132a of the underlying wettability-variable layer 132 disposed below the conductive layers 133.

EXAMPLE 2

Figure 16:
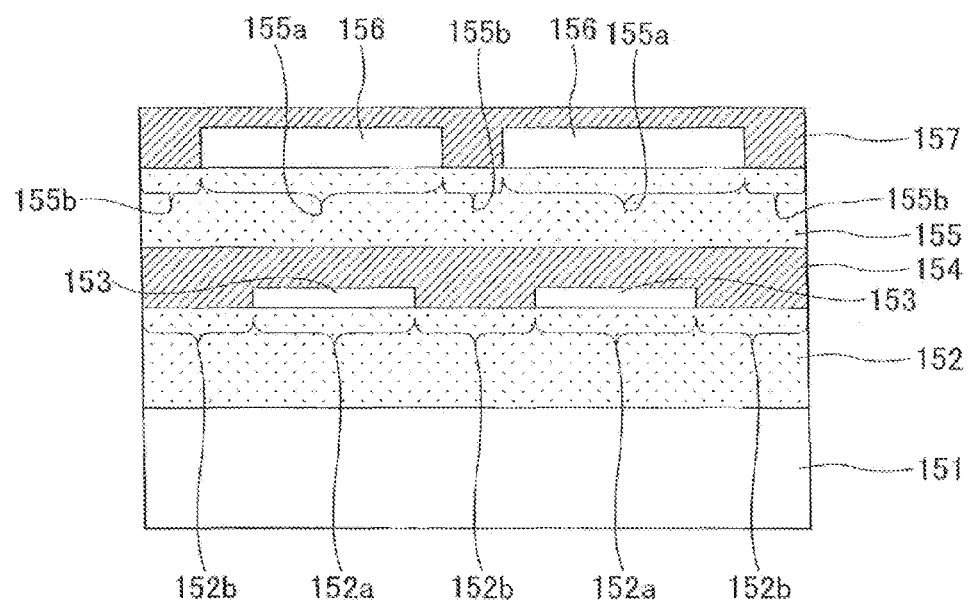
FIG. 16 is a cross-sectional view illustrating formation of a laminate structure according to an example 2 of the second embodiment.

FIG. 16 is a cross-sectional view illustrating formation of a laminate structure according to an example 2 of the present embodiment.

The laminate structure shown in FIG. 16 includes a glass substrate 151, a first wettability-variable layer 152, first conductive layers 153, a first insulating layer 154, a second wettability-variable layer 155, second conductive layers 156, and a second insulating layer 157.

The first wettability-variable layer 152 includes high surface free energy regions 152a and low surface free energy regions 152b. The second wettability-variable layer 155 includes high surface free energy regions 155a (the second surface free energy region) and low surface free energy regions 155b (the first surface free energy region).

Below, the process of fabricating the laminate structure shown in FIG. 16 is described.

First, an NMP (N-methyl-2-pyrrolidone) solution of a polyimide having a hydrophobic group on a side chain as that used in the example 1, is applied by spin-coating on the glass substrate 151 to form the first wettability-variable layer 152 having a thickness of 50 nm.

Next, ultraviolet rays having a wavelength less than 300 nm are irradiated from an extra high pressure mercury lamp onto the first wettability-variable layer 152 through a photo-mask with an exposure dose of 8 J/cm², thereby forming the high surface free energy regions 152a on the first wettability-variable layer 152.

Next, a metal particle disperse liquid including Ag particles is ejected, by inkjet, onto the high surface free energy regions 152a, and the thus obtained structure is heated at a temperature of 200° C. to form the first conductive layers 153 having an electrode width of 80 μm and a thickness of 100 nm.

Next, as in the example 1, an epoxy resin is applied by spin coating to form the insulating layer 154 on the first conductive layer 153.

Next, an NMP (N-methyl-2-pyrrolidone) solution of a polyimide having a hydrophobic group on a side chain is applied by spin-coating on the insulating layer 154 to form the second wettability-variable layer 155 having a thickness of 50 nm.

Next, ultraviolet rays having a wavelength less than 300 nm are irradiated from an extra high pressure mercury lamp onto the first wettability-variable layer 152 through a photo-mask with an exposure dose of 8 J/cm², thereby forming the high surface free energy regions 155a on the first wettability-variable layer 155.

Next, a metal particle disperse liquid including Ag particles is ejected, by inkjet, onto the high surface free energy regions 155a, and the thus obtained structure is heated at a temperature of 200° C. to form the second conductive layers 156 having an electrode width of 100 μm and a thickness of 100 nm.

Next, in order to sustain the insulating property of the second conductive layers 156, an epoxy resin is applied by spin-coating to form the insulating layer 157 on the second conductive layers 156.

According to this example, since the first wettability-variable layer 152, the first conductive layers 153, the first insulating layer 154, the second wettability-variable layer 155, the second conductive layers 156, and the second insulating layer 157 are formed by printing, such as spin-coating and inkjet, it is possible to fabricate a laminate structure of low cost.

In addition, since a large number of depressions are selectively formed, by exposure to the ultraviolet rays, on portions of the high surface free energy regions of the underlying wettability-variable layer on which the conductive layers are to be disposed, it is possible to fabricate a laminate structure which includes plural conductive layers formed of metal particle disperse liquid including metal particles stacked with insulating films in between, and has high adhesiveness between the conductive layers and the high surface free energy regions of the underlying wettability-variable layers.

EXAMPLE 3

An example 3 of the present embodiment is related to an organic transistor.

The organic transistor of the present example is basically the same as that shown in FIG. 6. Here, primarily, a fabrication process and adhesiveness conditions of the organic transistor in FIG. 6 are described.

The organic transistor as shown in FIG. 6, which is an example of an electronic device, includes a film substrate 21, a gate electrode 22, a second wettability-variable layer 24 also serving as a gate insulating film, source-drain electrodes 25, an organic semiconductor layer 26, and a first wettability-variable layer 31.

Below, a process of fabricating the organic transistor as shown in FIG. 6 according to the present example is described.

First, an NMP (N-methyl-2-pyrrolidone) solution of a polyimide having a hydrophobic group on a side chain as that used in the example 1, is applied by spin-coating on the film substrate 21 to form the first wettability-variable layer 31 which has a thickness of 50 nm and serves as an underlying layer.

Next, ultraviolet rays of a wavelength less than 300 nm (from an extra high pressure mercury lamp) are irradiated with a dose of 8 J/cm² to form high surface free energy regions on the first wettability-variable layer 31. As in example 1 and example 2, the regions exposed by the ultraviolet rays constitute the high surface free energy regions, and the regions not exposed by the ultraviolet rays constitute the low surface free energy regions.

Next, by means of inkjet, a metal particle disperse liquid including Ag particles is ejected onto the high surface free energy regions, and the resulting structure is heated at a temperature of 180° C. to form the gate electrode 22 having an electrode width of 50 μm and a thickness of 100 nm. On the gate electrode 22, a mixing solution of a polyimide solution PI100 (manufactured by Maruzen Petrochemical CO. LTD.) and the NMP (N-methyl-2-pyrrolidone) solution of polyimide as that used in the example 1 is applied by spin-coating and is heated at a temperature of 180 C to form the second wettability-variable layer 24 having a thickness of 400 nm and also serving as the gate insulating film.

Next, ultraviolet rays of a wavelength less than 300 nm (from an extra high pressure mercury lamp) are irradiated with a dose of 10 J/cm² through a photo-mask having line-shaped patterns at intervals of 5 μm to form the high surface free energy regions on the underlying second wettability-variable layer 24. As in example 1 and example 2, the regions exposed to the ultraviolet rays constitute the high surface free energy regions, and the regions not exposed to the ultraviolet rays constitute the low surface free energy regions.

Next, by means of inkjet, a metal particle disperse liquid including Ag particles is ejected onto the high surface free energy regions, and the resulting structure is heated at a temperature of 180° C. to form the source-drain electrodes 25 having a thickness of 100 nm.

Next, an application liquid, which is obtained by dissolving triarylamine (organic semiconductor materials) represented by the above-mentioned chemical formula 1 in a mixing solvent of xylene and mesitylene, is dropped onto a channel length portion by inkjet, and is dried at a temperature of 120° C. to form the organic semiconductor layer 26 having a film thickness of 30 nm.

In this way, the organic transistor as shown in FIG. 6 is fabricated. In this organic transistor, the underlying second wettability-variable layer 24 also functions as a gate insulating film.

Through evaluation of the transistor characteristics, it is found that patterning performance of the electrodes is good, the on-off ratio Ion/Ioff, which is a ratio of the current in an ON state to the current in an OFF state, is over 10000, and the field effect mobility is $4 \times 10^{-3}$ cm²/V/s.

In addition, the adhesiveness between the gate electrode 22 and the source-drain electrodes 25 is good. Therefore, an electronic device having fine interconnections is obtained by printing techniques at low cost.

In addition, since fine depressions can be formed only on the surface where the gate electrode 22 and the source-drain electrodes 25 are to be formed, the portion where the organic semiconductor layer 26 is to be formed is smooth. As a result, electrical conductance is not adversely influenced, and it is expected that the crystalline property can be improved when a crystalline organic semiconductor layer is used.

In this example, although polymer material is used, because the channel interface has low surface free energy, it is expected that good performance can be obtained.

In the above, it is described that the semiconductor layer 26 is formed of a polymer organic semiconductor material expressed by the above-mentioned chemical formula 1, but the semiconductor layer 26 may be formed of inorganic semiconductors like CdSe, CdTe, or Si, or formed of organic semiconductors such as organic low molecules, like pentacene, anthracene, tetracene, or phthalocyanine, polyacetylene-based conductive polymers, polyphenylene-based conductive polymers like poly(p-phenylene) and its derivatives, poly(phenylenevinylene) and its derivatives, heterocyclic conductive polymers like polypyrrole and its derivatives, polythiophene and its derivatives, polyfuran and its derivatives, or ionic conductive polymers like polyaniline and its derivatives. Especially, it is preferable that the semiconductor layer 26 be formed of organic semiconductors suitable for the printing process which has low cost.

According to the present example, it is possible to obtain a laminate structure which has improved adhesiveness between the conductive layer and the underlying wettability-variable layer, and allows fine patterns to be formed at low cost. In addition, because the semiconductor layer and the insulating layer are provided, it is possible to obtain an electronic device having high reliability.

In addition, because an organic semiconductor material is used as the semiconductor layer, the conductive layer formed of metal particle disperse liquid including metal particles has high adhesiveness, and it is possible to obtain a laminate structure allowing fine patterns to be formed at low cost, and it is possible to fabricate an electronic device using the laminate structure at low cost.

Further, because the second wettability-variable layer also serves as a gate insulating film, it is possible to obtain a laminate structure which has improved adhesiveness between the conductive layer and the underlying wettability-variable layer and allows fine patterns to be formed at low cost, and it is possible to fabricate an electronic device using the laminate structure at low cost.

Further, a method of fabricating a semiconductor device of the present example includes a step of forming a gate electrode, a step of forming a gate insulating film, a step of forming source-drain electrodes, and a step of forming a semiconductor layer, a step of forming the high surface free energy regions and the low surface free energy regions by changing the critical surface tension (surface free energy) of the wettability-variable layer when forming one or more of the above electrodes, and a step of forming the conductive layer on the high surface free energy regions of the wettability-variable layer by applying the metal particle disperse liquid including metal particles on the high surface free energy regions. A large number of fine depressions are selectively formed on the high surface free energy regions of the wettability-variable layer to form the conductive layer on the wettability-variable layer. According to this method, the adhesiveness between the conductive layer formed of metal particle disperse liquid including metal particles, and the high surface free energy regions of the underlying wettability-variable layer disposed below the conductive layers is further improved, and it is possible to fabricate an electronic device at low cost and of high reliability.

Since the fine depressions are formed by exposure to ultraviolet rays, it is possible to fabricate an electronic device having high reliability and low cost.

EXAMPLE 4

An example 4 of the present embodiment is related to an organic transistor.

The organic transistor of the present example is basically the same as that shown in FIG. 7. Here, primarily, a fabrication process and adhesiveness conditions of the organic transistor in FIG. 7 are described.

The organic transistor shown in FIG. 7, which is an example of an electronic device, includes a film substrate 21, a gate electrode 22, an insulating layer 23, a second wettability-variable layer 24, source-drain electrodes 25, an organic semiconductor layer 26, and a first wettability-variable layer 31.

Below, a process of fabricating the organic transistor as shown in FIG. 7 according to the present example is described.

First, an NMP (N-methyl-2-pyrrolidone) solution of a polyimide having a hydrophobic group on a side chain as that used in the example 1, is applied by spin-coating on the film substrate 21 to form the first wettability-variable layer 31 which has a thickness of 50 nm and serves as an underlying layer.

Next, ultraviolet rays of a wavelength less than 300 nm (from an extra high pressure mercury lamp) are irradiated with a dose of 8 J/cm$^2$ to form high surface free energy regions on the first wettability-variable layer 31. As in example 1 and example 2, the regions exposed by the ultraviolet rays constitute the high surface free energy regions, and the regions not exposed by the ultraviolet rays constitute the low surface free energy regions.

Next, by means of inkjet, a metal particle disperse liquid including Ag particles is ejected onto the high surface free energy regions, and the resulting structure is heated at a temperature of 180° C. to form the gate electrode 22 having an electrode width of 50 μm and a thickness of 100 nm. On the gate electrode 22, a mixing solution of a polyimide solution PI213B (manufactured by Maruzen Petrochemical CO. LTD.) and the NMP (N-methyl-2-pyrrolidone) solution of polyimide as that used in the example 1 is applied by spin-coating and is heated at a temperature of 180° C. to form the gate insulating film 23 having a thickness of 500 nm.

Next, similarly, on the gate insulating film 23, the second wettability-variable layer 24 having a thickness of 50 nm is formed of polyimide as in the example 3.

Next, ultraviolet rays of a wavelength less than 300 nm (from an extra high pressure mercury lamp) are irradiated with a dose of 10 J/cm$^2$ through a photo-mask having line-shaped patterns at intervals of 5 μm to form the high surface free energy regions on the underlying second wettability-variable layer 24. As in example 1 through example 3, the regions exposed to the ultraviolet rays constitute the high surface free energy regions, and the regions not exposed to the ultraviolet rays constitute the low surface free energy regions.

Next, by means of inkjet, a metal particle disperse liquid including Ag particles is ejected onto the high surface free energy regions, and the resulting structure is heated at a temperature of 180° C. to form the source-drain electrodes 25 having a thickness of 100 nm.

Next, in the same way as in the example 4, the organic semiconductor layer 26 is formed, and an organic transistor of the present example is fabricated. In the organic transistor, the insulating layer 23 and the second wettability-variable layer 24 function as a gate insulating film.

Through evaluation of the transistor characteristics, it is found that patterning performance of the gate electrode 22 and the source-drain electrodes 25 is good, the on-off ratio Ion/Ioff, which is a ratio of the current in an ON state to the current in an OFF state, is over 10000, and the field effect mobility is $3 \times 10^{-3}$ cm$^2$/V/s.

According to the present example, it is possible to obtain a laminate structure which has improved adhesiveness between the conductive layer and the underlying wettability-variable layer, and allows fine patterns to be formed at low cost. In addition, because the semiconductor layer and the insulating layer are provided, it is possible to fabricate an electronic device having high reliability at low cost.

In addition, because an organic semiconductor material is used as the semiconductor layer, the conductive layer formed of metal particle disperse liquid including metal particles has high adhesiveness, and it is possible to obtain a laminate structure allowing fine patterns to be formed at low cost, and it is possible to fabricate an electronic device using the laminate structure at low cost.

Further, because the second wettability-variable layer also serves as a gate insulating film, it is possible to obtain a laminate structure which has improved adhesiveness between the conductive layer and the underlying wettability-variable layer, and allows fine patterns to be formed at low cost, and it is possible to fabricate an electronic device using the laminate structure at low cost.

Because the insulating layer and the second wettability-variable layer are arranged at positions as shown in FIG. 7, it makes it easy to functionally design the insulating property and wettability control, and make it possible to realize further high performance.

Further, a method of fabricating a semiconductor device of the present example includes a step of forming a gate electrode, a step of forming a gate insulating film, a step of forming source-drain electrodes, and a step of forming a semiconductor layer, a step of forming the high surface free energy regions and the low surface free energy regions by changing the critical surface tension (surface free energy) of the wettability-variable layer when forming one or more of the above electrodes, and a step of forming the conductive layer on the high surface free energy regions of the wettability-variable layer by applying the metal particle disperse liquid including metal particles on the high surface free energy regions. A large number of fine depressions are selectively formed on the high surface free energy regions of the wettability-variable layer to form the conductive layer on the wettability-variable layer. According to this method, the adhesiveness between the conductive layer formed of metal particle disperse liquid including metal particles, and the high surface free energy regions of the underlying wettability-variable layer disposed below the conductive layers is further improved, and it is possible to fabricate an electronic device at low cost and of high reliability.

Since the fine depressions are formed by exposure to ultraviolet rays, it is possible to fabricate an electronic device having high reliability and low cost.

EXAMPLE 5

An example 5 of the present embodiment is related to an electronic device array.

The electronic device array of the present example is basically the same as that shown in FIG. 8A and FIG. 8B. Here, primarily, a fabrication process and adhesiveness conditions of the organic transistor in the electronic device array in FIG. 8A and FIG. 8B are described.

The electronic device array of this example includes plural electronic devices 41 (organic transistors) each having the same structure as the organic transistor in the example 3. Specifically, 200×200 organic transistors 41 having element-pitches of 127 μm are arranged on the substrate 21 in a two-dimensional array. Each of the organic transistors 41 is formed in the same way as that in the example 3.

Through evaluation of the transistor characteristics, it is found that the average field effect mobility of the organic transistors 41 is $1.3 \times 10^{-3}$ cm$^2$/V/s.

Because the conductive layer is formed of metal particle disperse liquid including metal particles, and a large number of fine depressions are selectively formed in areas of the underlying wettability-variable layer, adhesiveness is improved, exfoliation of the conductive layer can hardly occur, and it is possible to form an electronic device array of high reliability and low cost.

According to the present example, it is possible to obtain a laminate structure which has improved adhesiveness between the conductive layer and the underlying wettability-variable layer and allows fine patterns to be formed at low cost, and obtain an electronic device using such a laminate structure; by arranging plural such electronic devices on a substrate, it is possible to fabricate an electronic device array having high reliability at low cost.

EXAMPLE 6

An example 6 of the present embodiment is related to a display device.

The display device of the present example is basically the same as that shown in FIG. 9. Here, primarily, a fabrication process and adhesiveness conditions of the organic transistor in the display device in FIG. 9 are described.

The display device shown in FIG. 9 includes a polyethylene naphthalate substrate 52 serving as an opposite substrate, microcapsules 51 serving as display elements, titanium oxide particles 51a, oil-blue-colored isopar 51b, an ITO transparent electrode 53, and a PVA (polyvinyl alcohol) binder 54.

The display device using the electronic device array as shown in FIG. 8A and FIG. 8B is fabricated as below. Specifically, an application liquid obtained by mixing the microcapsules 51, which include the titanium oxide particles 51a and the oil-blue-colored isopar 51b, and a water solution of polyvinyl alcohol (PVA) is applied on the ITO transparent electrode 53 arranged on the polyethylene naphthalate substrate 52, thereby forming a layer including the microcapsules 51 and the PVA binder 54. The thus obtained substrate and the electronic device array as shown in FIG. 8A and FIG. 8B are combined together so that the substrate 21 and the ITO transparent electrode 53 are on the outer side. A driver IC for use of scan signals is connected to a bus line in connection with the gate electrodes 22, and a driver IC for use of data signals is connected to a bus line in connection with the source electrodes 25a.

When switching displayed images each 0.5 seconds, it is found that still images are displayed properly.

According to the present example, it is possible to obtain a laminate structure which has improved adhesiveness between the conductive layer formed of metal particle disperse liquid including metal particles and the high surface free energy regions of the underlying wettability-variable layer where the conductive layer is to be formed and a large number of fine depressions are selectively formed, allows fine patterns to be formed at low cost, and to obtain an electronic device using such a laminate structure; by arranging plural such electronic devices on a substrate, it is possible to fabricate an electronic device array, and with the electronic device array, it is possible to obtain a display device having high reliability at low cost.

While the present invention is described with reference to specific embodiments chosen for purpose of illustration, it should be apparent that the invention is not limited to these embodiments, but numerous modifications could be made thereto by those skilled in the art without departing from the basic concept and scope of the invention.

This patent application is based on Japanese Priority Patent Applications No. 2007-187629 filed on Jul. 18, 2007, No. 2007-187630 filed on Jul. 18, 2007, and No. 2007-187631 filed on Jul. 18, 2007, the entire contents of which are hereby incorporated herein by reference.

The Invention claimed is:

1. A laminate structure, comprising:
a wettability-variable layer including
a first surface free energy region that has a first film thickness, and
a second surface free energy region that has a second film thickness, the second film thickness being less than the first film thickness and a surface free energy of said second surface free energy region being made higher than a surface free energy of the first surface free energy region by applying a predetermined amount of energy on said second surface free energy region, said second surface free energy region having a groove along a boundary between the first surface free energy region and the second surface free energy region; and
a conductive layer formed on the second surface free energy region of the wettability-variable layer.

2. The laminate structure as claimed in claim 1, wherein a plurality of depressions is formed on a surface of said second surface free energy region.

3. The laminate structure as claimed in claim 2, wherein a difference between the second film thickness of the second surface free energy region and the first film thickness of the first surface free energy region is greater than or equal to 5 nm, and is less than or equal to 10% of the first film thickness.

4. The laminate structure as claimed in claim 1, wherein a difference between the second film thickness of the second surface free energy region and the first film thickness of the first surface free energy region is greater than or equal to 5 nm, and is less than or equal to 10% of the first film thickness.

5. The laminate structure as claimed in claim 1, wherein
the wettability-variable layer includes a first material and a second material,
an electrical insulating property of the first material is better than the electrical insulating property of the second material, and
an increase rate of the surface free energy of the second material caused by applying a predetermined amount of energy is greater than an increase rate of the surface free energy of the first material caused by applying the predetermined amount of energy.

6. The laminate structure as claimed in claim 5, wherein the second material is formed of a polymer having a hydrophobic group on a side chain.

7. The laminate structure as claimed in claim 6, wherein the polymer includes polyimide.

8. The laminate structure as claimed in claim 7, wherein
the wettability-variable layer is formed of a blend material including
a polyimide having a main chain and a side chain, said side chain controlling wettability and resulting in low surface free energy before energy application; and
a polyimide having a main chain only.

9. The laminate structure as claimed in claim 7, wherein
the wettability-variable layer is formed of a blend material including
a polyamic acid that is a precursor of a polyimide having a main chain and a side chain, said side chain controlling wettability and resulting in low surface free energy before applying energy; and a polyamic acid that is a precursor of a polyimide having a main chain only.

10. An electronic device, comprising:
a substrate;
an electrode;
a semiconductor layer; and
an insulating layer, wherein
the electrode, the semiconductor layer, and the insulating layer are formed on the substrate, and
the electrode includes a laminate structure which has
a wettability-variable layer including a first surface free energy region that has a first film thickness, and a second surface free energy region that has a second film thickness, the second film thickness being less than the first film thickness and a surface free energy of said second surface free energy region being made higher than the surface free energy of the first surface free energy region by applying a predetermined amount of energy on said second surface free energy region, said second surface free energy region having a groove along a boundary between the first surface free energy region and the second surface free energy region, and
a conductive layer formed on the second surface free energy region of the wettability-variable layer.

11. The electronic device as claimed in claim 10, wherein plural of the laminate structures are stacked with the insulating layer in between.

12. The electronic device as claimed in claim 10, wherein the wettability-variable layer of each of the laminate structures acts as the insulating layer.

13. The electronic device as claimed in claim 10, wherein plural the electronic devices are arranged on the substrate.

14. A display device, comprising:
a substrate;
an electronic device array having a plurality of electronic devices arranged on the substrate;
an opposite substrate; and
a display unit,
wherein each of the electronic devices includes
an electrode;
a semiconductor layer; and
an insulating layer, wherein
the electrode, the semiconductor layer, and the insulating layer are formed on the substrate, and
the electrode includes a laminate structure which has
a wettability-variable layer including a first surface free energy region that has a first film thickness, and a second surface free energy region that has a second film thickness, the second film thickness being less than the first film thickness and a surface free energy of said second surface free energy region being made higher than the surface free energy of the first surface free energy region by applying a predetermined amount of energy on said second surface free energy region, said second surface free energy region having a groove along a boundary between the first surface free energy region and the second surface free energy region, and
a conductive layer formed on the second surface free energy region of the wettability-variable layer.

* * * * *